(12) United States Patent
Shinbashi et al.

(10) Patent No.: US 10,481,971 B2
(45) Date of Patent: Nov. 19, 2019

(54) ENCODING DEVICE, MEMORY CONTROLLER, COMMUNICATION SYSTEM, AND ENCODING METHOD

(71) Applicant: Sony Corporation, Tokyo (JP)

(72) Inventors: Tatsuo Shinbashi, Tokyo (JP); Kenichi Nakanishi, Tokyo (JP); Yasushi Fujinami, Tokyo (JP); Hiroyuki Iwaki, Kanagawa (JP); Ken Ishii, Tokyo (JP); Hideaki Okubo, Saitama (JP)

(73) Assignee: Sony Corporation, Tokyo (JP)

( * ) Notice: Subject to any disclaimer, the term of this patent is extended or adjusted under 35 U.S.C. 154(b) by 50 days.

(21) Appl. No.: 15/736,079

(22) PCT Filed: Apr. 15, 2016

(86) PCT No.: PCT/JP2016/062159
§ 371 (c)(1),
(2) Date: Dec. 13, 2017

(87) PCT Pub. No.: WO2017/018008
PCT Pub. Date: Feb. 2, 2017

(65) Prior Publication Data
US 2018/0143871 A1 May 24, 2018

(30) Foreign Application Priority Data

Jul. 24, 2015 (JP) ................. 2015-146671

(51) Int. Cl.
*G06F 11/10* (2006.01)
*G06F 12/16* (2006.01)
(Continued)

(52) U.S. Cl.
CPC .......... *G06F 11/10* (2013.01); *G06F 11/1012* (2013.01); *G06F 12/16* (2013.01);
(Continued)

(58) Field of Classification Search
CPC .................................................. G06F 11/10008
(Continued)

(56) References Cited

U.S. PATENT DOCUMENTS 8,570,804 B2 * 10/2013 Shalvi .................... G11C 16/26
365/185.02
2006/0123328 A1 * 6/2006 Tonami .............. G11B 20/1426
714/801
(Continued)

FOREIGN PATENT DOCUMENTS

JP 08-335396 A 12/1996
JP 2004-164634 A 6/2004
(Continued)

*Primary Examiner* — Fritz Alphonse
(74) *Attorney, Agent, or Firm* — Michael Best & Friedrich LLP

(57) ABSTRACT

A data holding characteristic of a memory cell is improved in a memory system in which data is encoded and written to a memory cell.

A first candidate parity generation unit generates, as a first candidate parity, a parity for detecting an error in an information section in which a predetermined value is assigned in a predetermined variable area. A second candidate parity generation unit generates, as a second candidate parity, a parity for detecting an error in the information section in which a value different from the predetermined value is assigned in the predetermined variable area. A selection unit selects a parity that satisfies a predetermined condition from among the first and second candidate parities as a selection parity. An output unit outputs a codeword constituted by the information section corresponding to the selection parity and the selection parity.

17 Claims, 30 Drawing Sheets

(51) Int. Cl.
  *H03M 13/09* (2006.01)
  *H03M 13/35* (2006.01)
  *H03M 13/00* (2006.01)
  *G11C 16/02* (2006.01)
  *G11C 16/06* (2006.01)
  *H03M 13/15* (2006.01)
  *H03M 13/19* (2006.01)

(52) U.S. Cl.
  CPC ......... *H03M 13/095* (2013.01); *H03M 13/35* (2013.01); *H03M 13/611* (2013.01); *G11C 16/02* (2013.01); *G11C 16/06* (2013.01); *H03M 13/09* (2013.01); *H03M 13/152* (2013.01); *H03M 13/1515* (2013.01); *H03M 13/19* (2013.01)

(58) Field of Classification Search
  USPC ........................................ 714/763, 766, 768
  See application file for complete search history.

(56) References Cited

U.S. PATENT DOCUMENTS

| | | |
|---|---|---|
| 2013/0019142 A1 | 1/2013 | Teo et al. |
| 2015/0170765 A1* | 6/2015 | Chae .................. G06F 11/1008 714/721 |

FOREIGN PATENT DOCUMENTS

| | | |
|---|---|---|
| JP | 2011-508358 A | 3/2011 |
| JP | 2011-526398 A | 10/2011 |
| JP | 2013-239142 A | 11/2013 |
| JP | 2013-542533 A | 11/2013 |

* cited by examiner

FIG. 2
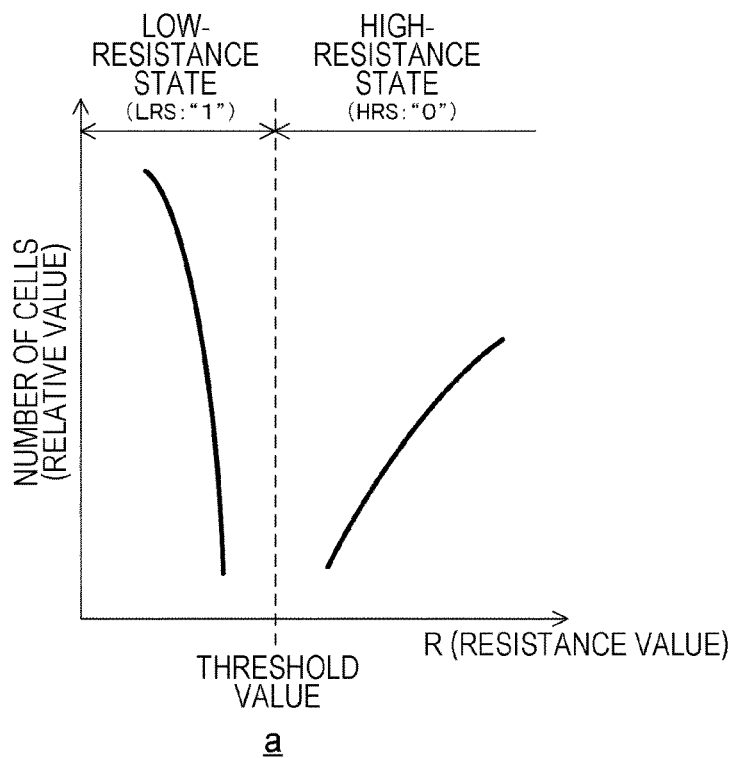
a
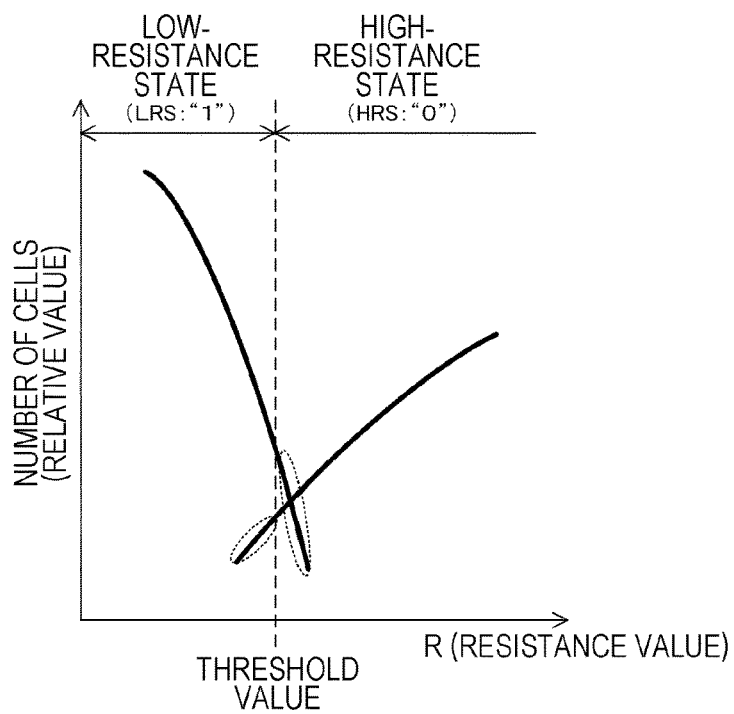
b

FIG. 5
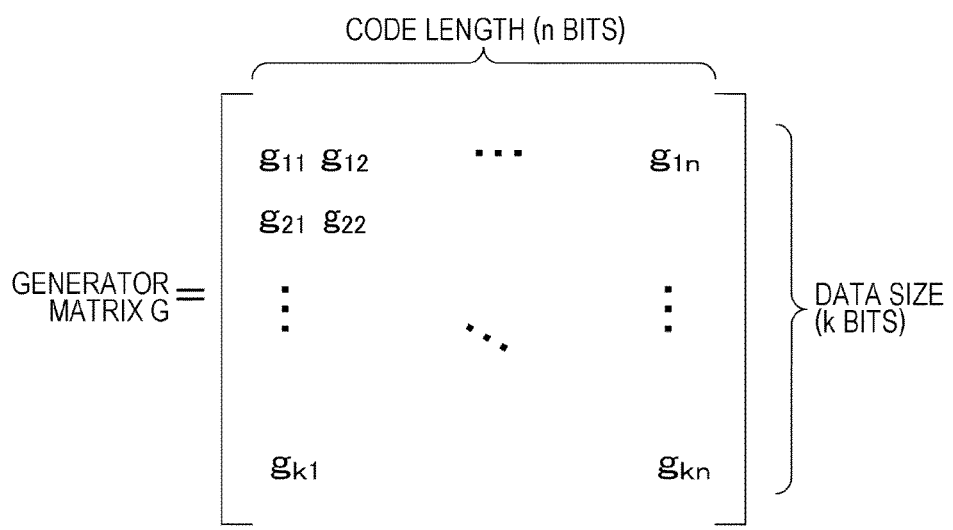
a
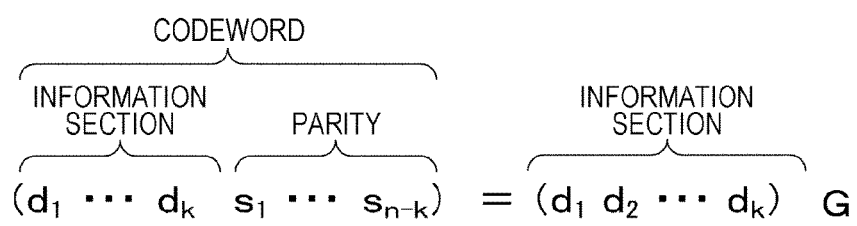
b

ENCODING DEVICE, MEMORY CONTROLLER, COMMUNICATION SYSTEM, AND ENCODING METHOD

TECHNICAL FIELD

The present technology relates to an encoding device, a memory controller, a communication system, and an encoding method. In more detail, the present technology relates to an encoding device, a memory controller, a communication system, and an encoding method that encodes data to write to a memory cell.

BACKGROUND ART

In recent information processing systems, a non-volatile memory (NVM) is sometimes used as an auxiliary storage device or a storage. This non-volatile memory is roughly divided into a flash memory compatible with data access with a large size as a unit and a non-volatile random access memory (NVRAM: non-volatile RAM) capable of high speed random access in a small unit. Here, a NAND type flash memory can be cited as a representative example of the flash memory. Meanwhile, examples of the non-volatile random access memory include a resistive RAM (ReRAM), a phase-change RAM (PCRAM), and a magnetoresistive RAM (MRAM).

In some of these non-volatile memories, a data holding characteristic when holding a logical value "0" are different from a data holding characteristic when holding a logical value "1". This data holding characteristic is also called retention. A memory controller that performs predetermined conversion processing (inversion or the like) on user data such that the number of "1" becomes fewer in a case where the data holding characteristic (retention) of the logical value "0" is better has been proposed (for example, refer to Patent Document 1). This memory controller adds, to the user data, a parity for detecting an error in the user data after the conversion processing to write to a memory cell.

CITATION LIST

Patent Document

Patent Document 1: Japanese Patent Application Laid-Open No. 2013-239142

SUMMARY OF THE INVENTION

Problems to be Solved by the Invention

In the conventional technology described above, the retention of the memory cell holding the user data is improved by inverting this user data. However, since the memory controller writes the parity as it is without inverting the parity, there is a problem that the retention of the memory cell holding the parity is not improved.

The present technology has been developed in view of such a situation and has as its object to improve the data holding characteristic of a memory cell in a memory system in which data is encoded and written to a memory cell.

Solutions to Problems

The present technology has been made in order to solve the above-mentioned problems and a first aspect thereof is an encoding device and an encoding method for the device including: a first candidate parity generation unit that generates, as a first candidate parity, a parity for detecting an error in an information section in which a predetermined value is assigned in a predetermined variable area; a second candidate parity generation unit that generates, as a second candidate parity, a parity for detecting an error in the information section in which a value different from the predetermined value is assigned in the predetermined variable area; a selection unit that selects a parity that satisfies a predetermined condition from among the first and second candidate parities as a selection parity; and an output unit that outputs a codeword constituted by the information section corresponding to the selection parity and the selection parity. With this configuration, an action is attained in which a codeword constituted by the selection parity that satisfies the predetermined condition among the first and second candidate parities and the information section corresponding to the selection parity is output.

In addition, in this first aspect, the information section may include user data input to the first candidate parity generation unit and unused data including the predetermined variable area. With this configuration, an action is attained in which a parity is generated from the information section in which the variable area is arranged in an area other than an area of the user data.

In addition, in this first aspect, the selection unit may include: a first weight counter that counts, as a weight, the number of bits having a specific value in the first candidate parity and the unused data corresponding to the first candidate parity; a second weight counter that counts, as a weight, the number of bits having the specific value in the second candidate parity and the unused data corresponding to the second candidate parity; and a comparison unit that compares respective count values of the first and second weight counters and selects a parity that satisfies the predetermined condition on the basis of a result of the comparison. With this configuration, an action is attained in which the parity is selected on the basis of the comparison result of a bit depth of the specific value.

In addition, in this first aspect, a control unit that reads data written in a memory cell as pre-read data may be further included, and the selection unit may include: a first rewrite bit depth counter that counts a bit depth of a value different from a value of the pre-read data as a rewrite bit depth in the first candidate parity and the unused data corresponding to the first candidate parity; a second rewrite bit depth counter that counts a bit depth of a value different from a value of the pre-read data as a rewrite bit depth in the second candidate parity and the unused data corresponding to the second candidate parity, and a comparison unit that compares the rewrite bit depths counted by the respective first and second rewrite bit depth counters and selects a parity that satisfies the predetermined condition on the basis of a result of the comparison. With this configuration, an action is attained in which the parity is selected on the basis of the comparison result of the rewrite bit depth.

In addition, in this first aspect, a control unit that reads data written in a memory cell as pre-read data may be further included, and the selection unit may include a first longest run counter that counts the number of consecutive bits having a value different from a value of bits of the pre-read data in the first candidate parity and the unused data corresponding to the first candidate parity and finds a maximum value of the count value as a length of a longest run, the selection unit further including: a second longest run counter that counts the number of consecutive bits having a value different from a value of bits of the pre-read data in the second candidate parity and the unused data corresponding to the second candidate parity and finds a maximum value of the count value as a length of a longest run; and a comparison unit that compares the lengths of the longest runs found by the respective first and second longest run number counters and selects a parity that satisfies the predetermined condition on the basis of a result of the comparison. With this configuration, an action is attained in which the parity is selected on the basis of the comparison result of the length of the longest run.

In addition, in this first aspect, the unused data may be arranged between the user data and the selection parity in the codeword. With this configuration, an action is attained in which the unused data arranged between the user data and the selection parity is altered.

In addition, in this first aspect, the user data may be arranged between the unused data and the selection parity in the codeword. With this configuration, an action is attained in which the unused data of the codeword in which the user data is arranged between the unused data and the selection parity is altered.

In addition, in this first aspect, the user data may be arranged by being dispersed in a plurality of areas in the codeword. With this configuration, an action is attained in which the unused data of the codeword in which the user data is arranged by being dispersed in a plurality of areas is altered.

In addition, in this first aspect, the unused data may be arranged by being dispersed in a plurality of areas in the codeword. With this configuration, an action is attained in which the unused data arranged by being dispersed in a plurality of areas is altered.

In addition, in this first aspect, the unused data may be constituted by the variable area and a fixed area in which a value is not altered, and the second candidate parity generation unit may generate the second candidate parity corresponding to the information section in which a value of the variable area has been altered. With this configuration, an action is attained in which a value of the variable area in the unused data is altered.

In addition, in this first aspect, the variable area may be arranged by being dispersed in a plurality of areas in the codeword. With this configuration, an action is attained in which the variable area arranged by being dispersed in a plurality of areas is altered.

In addition, in this first aspect, the fixed area may be arranged by being dispersed in a plurality of areas in the codeword. With this configuration, an action is attained in which the unused data of the codeword in which the fixed area is arranged by being dispersed in a plurality of areas is altered.

In addition, in this first aspect, the first candidate parity generation unit may generate the first candidate parity from the information section, and the second candidate parity generation unit may generate the second candidate parity by a logical operation between the first candidate parity and a first parity pattern. With this configuration, an action is attained in which the second candidate parity is generated by the logical operation between the first candidate parity and the first parity pattern.

In addition, in this first aspect, a third candidate parity generation unit that generates a third candidate parity by a logical operation between a second parity pattern and the first candidate parity and a fourth candidate parity generation unit that generates a fourth candidate parity by a logical operation between the second parity pattern and the second candidate parity may be further included, and the selection unit may select a parity that satisfies the predetermined condition from among the first, second, third, and fourth candidate parities as the selection parity. With this configuration, an action is attained in which the third candidate parity is generated by the logical operation between the second parity pattern and the first candidate parity and the fourth candidate parity is generated by the logical operation between the second parity pattern and the second candidate parity.

In addition, in this first aspect, a user data conversion unit that performs conversion processing of converting a bit depth of a specific value in the user data and outputs either the user data after the conversion processing or the user data before the conversion processing to the first candidate parity generation unit may be further included, and the first candidate parity generation unit may generate the first candidate parity from the first information section including the output user data. With this configuration, an action is attained in which the bit depth of the specific value in the user data is converted.

Meanwhile, a second aspect of the present technology is a memory controller including: a first candidate parity generation unit that generates, as a first candidate parity, a parity for detecting an error in an information section in which a predetermined value is assigned in a predetermined variable area; a second candidate parity generation unit that generates, as a second candidate parity, a parity for detecting an error in the information section in which a value different from the predetermined value is assigned in the predetermined variable area; a selection unit that selects a parity that satisfies a predetermined condition from among the first and second candidate parities as a selection parity; an output unit that outputs a codeword constituted by the information section corresponding to the selection parity and the selection parity to a memory cell as write data; and a decoding unit that reads read data from the memory cell and decodes the read data. With this configuration, an action is attained in which a codeword constituted by the selection parity that satisfies the predetermined condition among the first and second candidate parities and the information section corresponding to the selection parity is output.

Furthermore, a third aspect of the present technology is a communication system including: a first candidate parity generation unit that generates, as a first candidate parity, a parity for detecting an error in an information section in which a predetermined value is assigned in a predetermined variable area; a second candidate parity generation unit that generates, as a second candidate parity, a parity for detecting an error in the information section in which a value different from the predetermined value is assigned in the predetermined variable area; a selection unit that selects a parity that satisfies a predetermined condition from among the first and second candidate parities as a selection parity; an output unit that outputs a codeword constituted by the information section corresponding to the selection parity and the selection parity as a transmission word; and a decoding unit that receives a received word corresponding to the transmission word to decode. With this configuration, an action is attained in which a codeword constituted by the selection parity that satisfies the predetermined condition among the first and second candidate parities and the information section corresponding to the selection parity is output.

Effects of the Invention

According to the present technology, it is possible to achieve an excellent effect that a data holding characteristic of a memory cell can be improved in a memory system in which data is encoded and written to a memory cell. Note that the effects described herein are not necessarily limited and any effects described in the present disclosure may be applied.

BRIEF DESCRIPTION OF DRAWINGS

FIG. 2 is a diagram illustrating examples of a resistance distribution of a variable resistance element in the first embodiment.

FIG. 5 is a diagram illustrating an example of a generator matrix and a codeword in the first embodiment.

MODE FOR CARRYING OUT THE INVENTION

Modes for carrying out the present technology (hereinafter, referred to as embodiments) will be described below. The description will be given in the following order.
1. First Embodiment (example of selecting one of candidate parities)
2. Second Embodiment (example of selecting one of candidate parities on the basis of rewrite bit depth)
3. Third Embodiment (example of selecting one of candidate parities by changing arrangement of selection values)
4. Fourth Embodiment (example of generating a new candidate parity from a parity pattern and a candidate parity and selecting one of them)
5. Fifth Embodiment (example of selecting one of candidate parities on the basis of the length of the longest run)

1. First Embodiment

[Configuration Example of Memory System]

Figure 1:
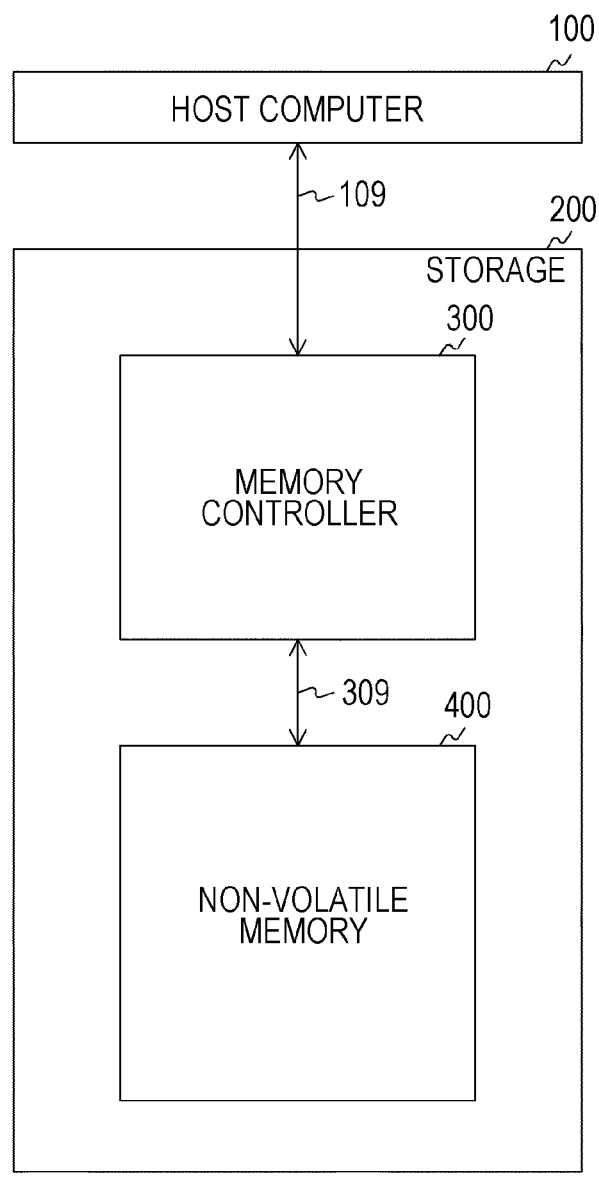
FIG. 1 is an overall diagram illustrating a configuration example of a memory system in a first embodiment.

FIG. 1 is a block diagram illustrating a configuration example of a memory system in an embodiment. This memory system is provided with a host computer 100 and a storage 200.

The host computer 100 controls the entire memory system. Specifically, the host computer 100 generates a command and data to supply to the storage 200 via a signal line 109. In addition, the host computer 100 receives data that has been read from the storage 200. Here, the command is for controlling the storage 200 and includes, for example, a write command instructing the writing of data and a read command instructing the reading of data.

The storage 200 is provided with a memory controller 300 and a non-volatile memory 400. The memory controller 300 controls the non-volatile memory 400. In the case of receiving the write command and data from the host computer 100, the memory controller 300 generates an error detection and correction code (ECC) from this data. The memory controller 300 accesses the non-volatile memory 400 via a signal line 309 and writes encoded data thereto.

In addition, in the case of receiving the read command from the host computer 100, the memory controller 300 accesses the non-volatile memory 400 via the signal line 309 and reads encoded data therefrom. Then, the memory controller 300 converts (that is, decodes) the encoded data into original data before encoding. During decoding, the memory controller 300 detects and corrects an error in the data on the basis of the ECC. The memory controller 300 supplies the corrected data to the host computer 100.

The non-volatile memory 400 stores data in accordance with the control of the memory controller 300. For example, a ReRAM is used as the non-volatile memory 400. This non-volatile memory 400 is provided with a plurality of memory cells and these memory cells are divided into a plurality of blocks. Here, the block is an access unit of the non-volatile memory 400 and is also called a sector. A memory address is allocated to each of the blocks. Note that, instead of the ReRAM, a flash memory, a PCRAM, an MRAM, or the like may be used as the non-volatile memory 400.

FIG. 2 is a diagram illustrating examples of a resistance distribution of a variable resistance element of the ReRAM in the first embodiment. In FIG. 2, a horizontal axis represents a resistance value and a vertical axis represents a relative distribution of the number of cells by relative values. The resistance state of the variable resistance element is roughly divided into two distributions with a predetermined threshold value as a boundary. A state in which the resistance value is lower than the threshold value is called a low-resistance state (LRS), whereas a state in which the resistance value is higher than the threshold value is called a high-resistance state (HRS). By applying a voltage to the variable resistance element, the non-volatile memory 400 is able to vary the resistance state thereof in a lossless manner to rewrite the memory cell. Since the resistance state is maintained even when this voltage application to the memory cell is stopped, the ReRAM can function as a non-volatile memory.

In addition, one of a logical value "0" and a logical value "1" is associated with each of the LRS and the HRS of the variable resistance element. For example, the logical value "1" is associated with the LRS and the logical value "0" is associated with the HRS. It is arbitrary which of the logical value "0" and the logical value "1" is associated with each state.

When a voltage higher than a certain level is applied to the memory cell in the HRS, this memory cell transitions to the LRS ("1"). This action is hereinafter referred to as "set" action. On the other hand, when a reverse voltage is applied to the memory cell in the LRS, this memory cell transitions to the HRS ("0"). This action is hereinafter referred to as "reset" action.

In FIG. 2, a is a diagram illustrating an example of the resistance distribution of a non-deteriorated variable resistance element. In a case where the variable resistance element is not deteriorated, the resistance values of all the memory cells in which "1" is written are lower than the threshold value and the resistance values of all the memory cells in which "0" is written are higher than the threshold value. Therefore, bits having the same value as the written value are read and no read error arises.

On the other hand, b of FIG. 2 is a diagram illustrating an example of the resistance distribution of a variable resistance element whose deterioration has progressed. As deterioration progresses due to aged deterioration or repeated access, the resistance value of the memory cell in which "1" is written rises and there is a fear that the resistance value will exceed the threshold value. The value of "0" is read from this memory cell exceeding the threshold value and an error occurs. In addition, the resistance value of the memory cell in which "0" is written decreases and there is a fear that the resistance value will fall below the threshold value. The value of "1" is readout from this memory cell falling down the threshold value and an error occurs. Portions surrounded by dotted lines in FIG. 2 indicate memory cells in which errors arise.

Here, an error tends to occur in the memory cell in the LRS as compared with the memory cell in the HRS. In other words, a data holding characteristic (retention) of the memory cell in the HRS is better than that in the LRS. Therefore, in a case where "1" is allocated to the LRS, an error occurs more frequently in the memory cell in which "1" is written than in the memory cell in which "0" is written. Since there is an upper limit in the number of errors that the ECC can correct, the higher the occurrence frequency of the error, the higher the possibility that the data becomes uncorrectable and cannot be held. Accordingly, as a bit depth of "1" becomes smaller, the data holding characteristic of the non-volatile memory 400 is improved.

[Configuration Example of Memory Controller]

Figure 3:
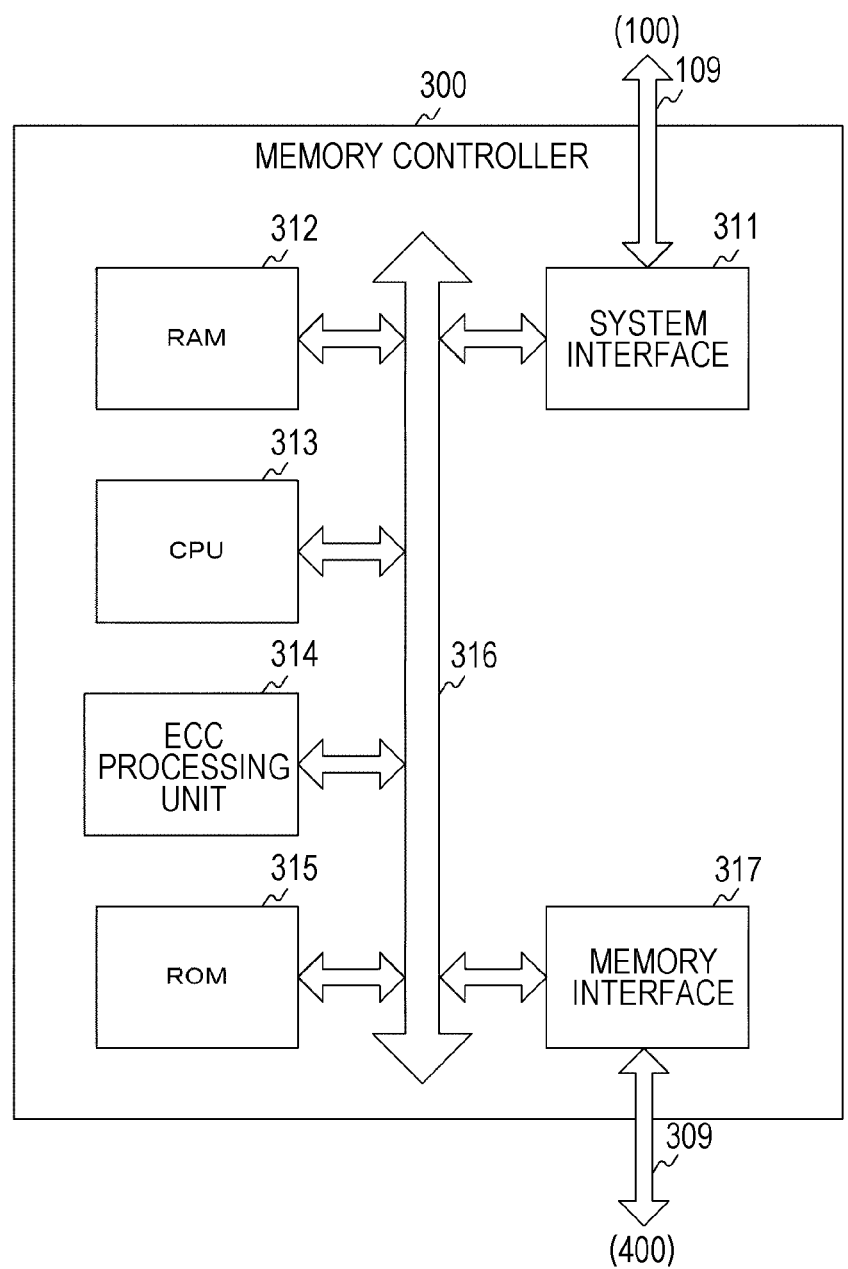
FIG. 3 is a block diagram illustrating a configuration example of a memory controller in the first embodiment.

FIG. 3 is a block diagram illustrating a configuration example of the memory controller 300 in the first embodiment. This memory controller 300 is provided with a random access memory (RAM) 312, a central processing unit (CPU) 313, an ECC processing unit 314, and a read only memory (ROM) 305. The memory controller 300 is also provided with a system interface 311, a bus 316, and a memory interface 317.

The RAM 312 temporarily holds data necessary for processing executed by the CPU 313. The CPU 313 controls the entire memory controller 300. The ROM 315 stores a program executed by the CPU 313 and so on. The system interface 311 mutually exchanges data and a command with the host computer 100. The bus 316 is a common path for the RAM 312, the CPU 313, the ECC processing unit 314, the ROM 315, the system interface 311, and the memory interface 317 to mutually exchange data. The memory interface 317 mutually exchanges data and a command with the non-volatile memory 400.

The ECC processing unit 314 encodes data to be encoded (user data and the like) and decodes the encoded data. Here, the user data is data generated by the host computer 100 and input to the memory controller 300. In the encoding of the user data, the ECC processing unit 314 encodes in certain units by adding a parity to an information section including the user data. Individual piece of data encoded in certain units is hereinafter referred to as "codeword". A code constituted by these codewords having a fixed length is called a linear block code. Then, the ECC processing unit 314 supplies the codeword as write data to the non-volatile memory 400 via the bus 316.

In addition, the ECC processing unit 314 decodes encoded read data into the original user data. In this decoding, the ECC processing unit 314 uses the parity to detect and correct an error in the codeword. The ECC processing unit 314 supplies the decoded original user data as correction data to the host computer 100 via the bus 316.

For example, a BCH code is used as the error detection and correction code in this ECC processing unit 314. For example, it is assumed that $GF(2^{16})$ is used as a definition field (finite field) of this BCH code. A polynomial on this $GF(2^{16})$ is represented by the following formula, for example.

$$p(x)=x^{16}+x^5+x^3+x^2+1 \qquad \text{Formula 1}$$

If a primitive element of this finite field is a, all elements of $GF(2^{16})$ can be represented by a power of a. In addition, G(x) represented by the following formula is used as a generator polynomial in encoding.

[Mathematical Formula 1]

$$G(x)=LCM[M_1(x),M_2(x),\ldots,M_{2t}(x)] \qquad \text{Formula 2}$$

In formula 2, LCM[ ] represents a least common multiple polynomial of respective polynomials in [ ]. In addition, $M_i(x)$ is a polynomial with the minimal degree (minimal polynomial) having $\alpha^i$ as a root. For example, a minimal polynomial corresponding to $\alpha(i=1)$ is $x^{16}+x^5+x^3+x^2+1$, whereas a minimal polynomial corresponding to $\alpha^3(i=3)$ is $x^{16}+x^8+x^6+x^3+x^4+x+1$.

The BCH code generated by the generator polynomial G(x) of formula 2 can correct an error up to t bits. The codeword in this BCH code is obtained by replacing a coefficient of the polynomial divisible by the generator polynomial G(x) with a bit string. In a case where a 1-bit error is corrected, a 16-bit parity is generated and, in a case where an error up to t bits is corrected, a parity of t×16 bits or less is generated. Details of the procedure of encoding and decoding the BCH code are described, for example, in "'Code Theory', Imai Hideki, The Institute of Electronics Information and Communication Engineers, March 1990, p. 151-155".

Note that, although the ECC processing unit 314 encodes into the BCH code, encoding into a code other than the BCH code may be carried out as long as a linear block code that can detect an error is obtained. The ECC processing unit 314 may encode into, for example, a cyclic redundancy check (CRC) code, a Hamming code, an extended Hamming code, or a Reed-Solomon (RS) code.

Figure 4:
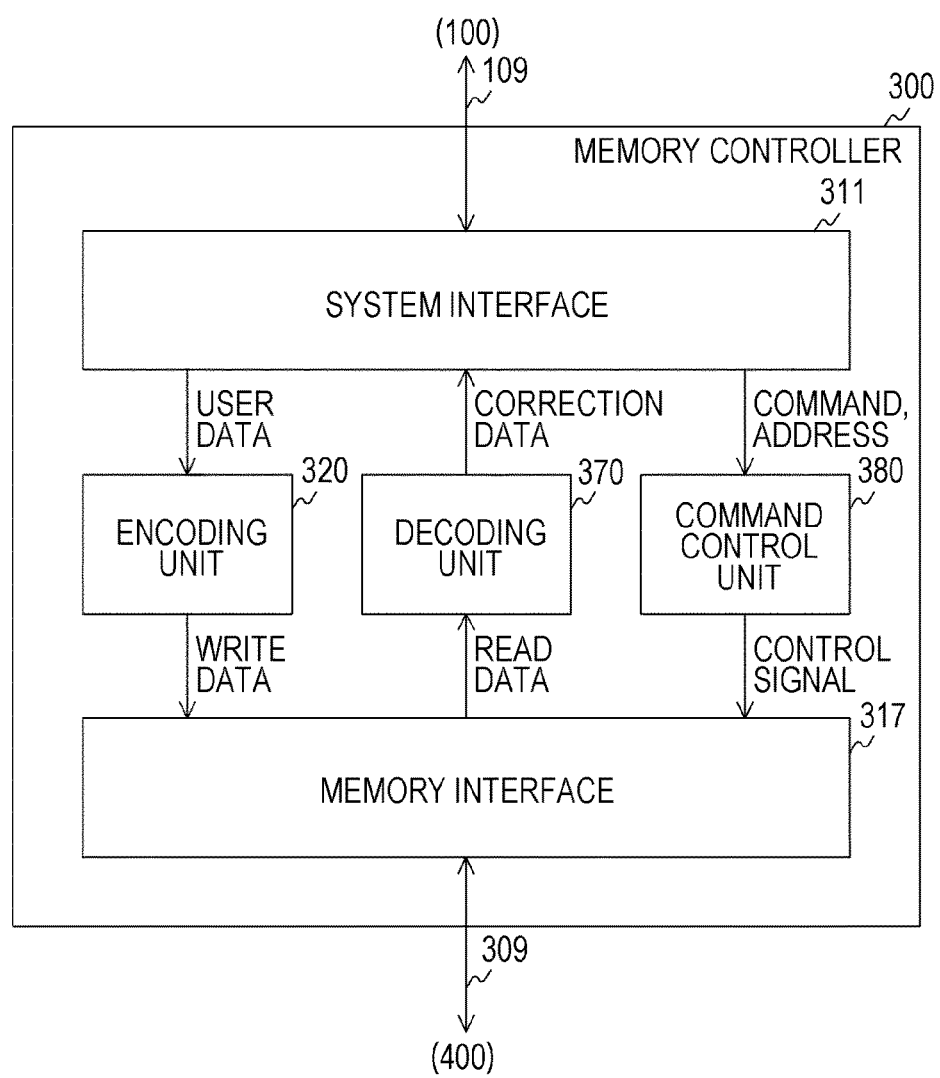
FIG. 4 is a block diagram illustrating a functional configuration example of the memory controller in the first embodiment.

FIG. 4 is a block diagram illustrating a functional configuration example of the memory controller 300 in the first embodiment. This memory controller 300 is provided with the system interface 311, an encoding unit 320, a decoding unit 370, a command control unit 380, and the memory interface 317. The encoding unit 320 and the decoding unit 370 in FIG. 4 are realized by the ECC processing unit 314 in FIG. 3 and the like. In addition, the command control unit 380 in FIG. 4 is realized by the RAM 312, the CPU 313, the ROM 315 in FIG. 3 and the like.

Note that the memory controller 300 is an example of an encoding device described in the claims.

The command control unit 380 decodes a command designating an address of an access destination. This command control unit 380 generates a control signal on the basis of a result of the decoding and supplies the control signal to the non-volatile memory 400 via the memory interface 317. This control signal is a signal for designating an address of an access destination and requesting the non-volatile memory 400 to read or write.

The encoding unit 320 encodes the user data. The encoding unit 320 encodes the user data to generate the write data and supplies the write data to the non-volatile memory 400 via the memory interface 317.

The decoding unit 370 decodes the read data read from the non-volatile memory 400. This decoding unit 370 detects and corrects an error in the read data and supplies the corrected user data to the host computer 100 via the system interface 311 as the correction data.

FIG. 5 is a diagram illustrating an example of a generator matrix and the codeword in the first embodiment. In FIG. 5, a is a diagram illustrating an example of a generator matrix G used for generating the codeword in the first embodiment. The number of rows of this generator matrix is k (k is an integer) and the number of columns thereof is n (n is an integer larger than k). In FIG. 5, b is an example of a calculation formula for finding the codeword from the generator matrix and the information section. Here, the data size of the information section is larger than the unit for encoding the user data and the user data is saved together with the other non-user data in this information section. As illustrated in b of FIG. 5, the codeword is generated by the product of the generator matrix G and the information section. This codeword contains k bits of information section and n−k bits of parity. In this manner, the parity is generated by the product of the information section and the generator matrix and thus, if even a part of the information section is altered, the parity corresponding to the altered information section also varies.

[Configuration Example of Codeword]

Figure 6:
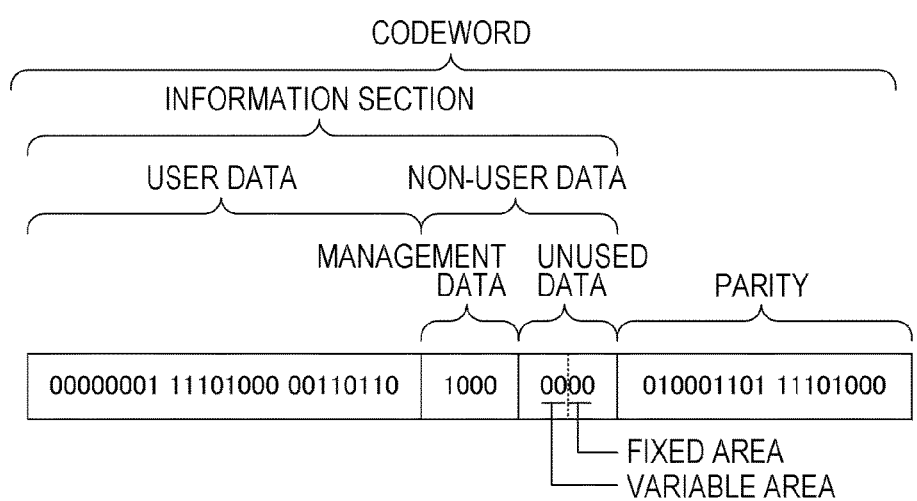
FIG. 6 is a diagram illustrating an example of a data configuration of a codeword in the first embodiment.

FIG. 6 is a diagram illustrating an example of a data configuration of the codeword in the first embodiment. The codeword is made up of a 4-byte information section and a 2-byte parity. This information section is constituted by 3-byte user data and 1-byte non-user data. Additionally, the non-user data is constituted by 4-bit management data and 4-bit unused data. Depending on the extensibility of the memory system and the convenience of the access unit, the non-user data of a size having a certain margin is provided in the codeword and the unused data is allocated to the remaining portion other than the management data. Note that the data size of each data in the codeword is not limited to the size exemplified in FIG. 6.

Here, the management data is data indicating the conversion processing performed at the time of encoding the user data. For example, in a case where the processing of inverting the user data is performed as the conversion processing, an inversion bit indicating whether the user data has been inverted is saved to the management data.

Meanwhile, the unused data is data not used for both of the user data and the management data among the non-user data. This unused data is constituted by a 2-bit fixed area and a 2-bit variable area. The fixed area is an area in which fixed-value data is saved in. For example, values of all the bits of the fixed area are fixed to "0". On the other hand, the variable area is an area in which data of one of a plurality of values is saved. For example, one of "00", "01", "10", and "11" in binary number is selected by the encoding unit 320 and data of that value is saved. The value of this data saved in the variable area is hereinafter referred to as "selection value". Note that, although both of the fixed area and the variable area are provided in the unused data, only the variable area may be provided without providing the fixed area.

For example, these pieces of data are arranged in the order of the parity, the fixed area, the variable area, the management data, and the user data sequentially from the right end of the codeword. That is, the parity is saved in 0th to 15th bits from the right end and 16th and 17th bits are used as the fixed area. In addition, the selection value is saved in 18th and 19th bits from the right end, the management data is saved in 20th to 23rd bits, and the user data is saved in the 24th and subsequent bits.

As described earlier, when even a part of the information section is altered, the parity corresponding to this information section also varies. Therefore, by altering the selection value, the encoding unit 320 can vary the parity corresponding to this altered information section. For example, the encoding unit 320 can generate four patterns of parity by varying the selection value to four patterns.

[Configuration Example of Encoding Unit]

Figure 7:
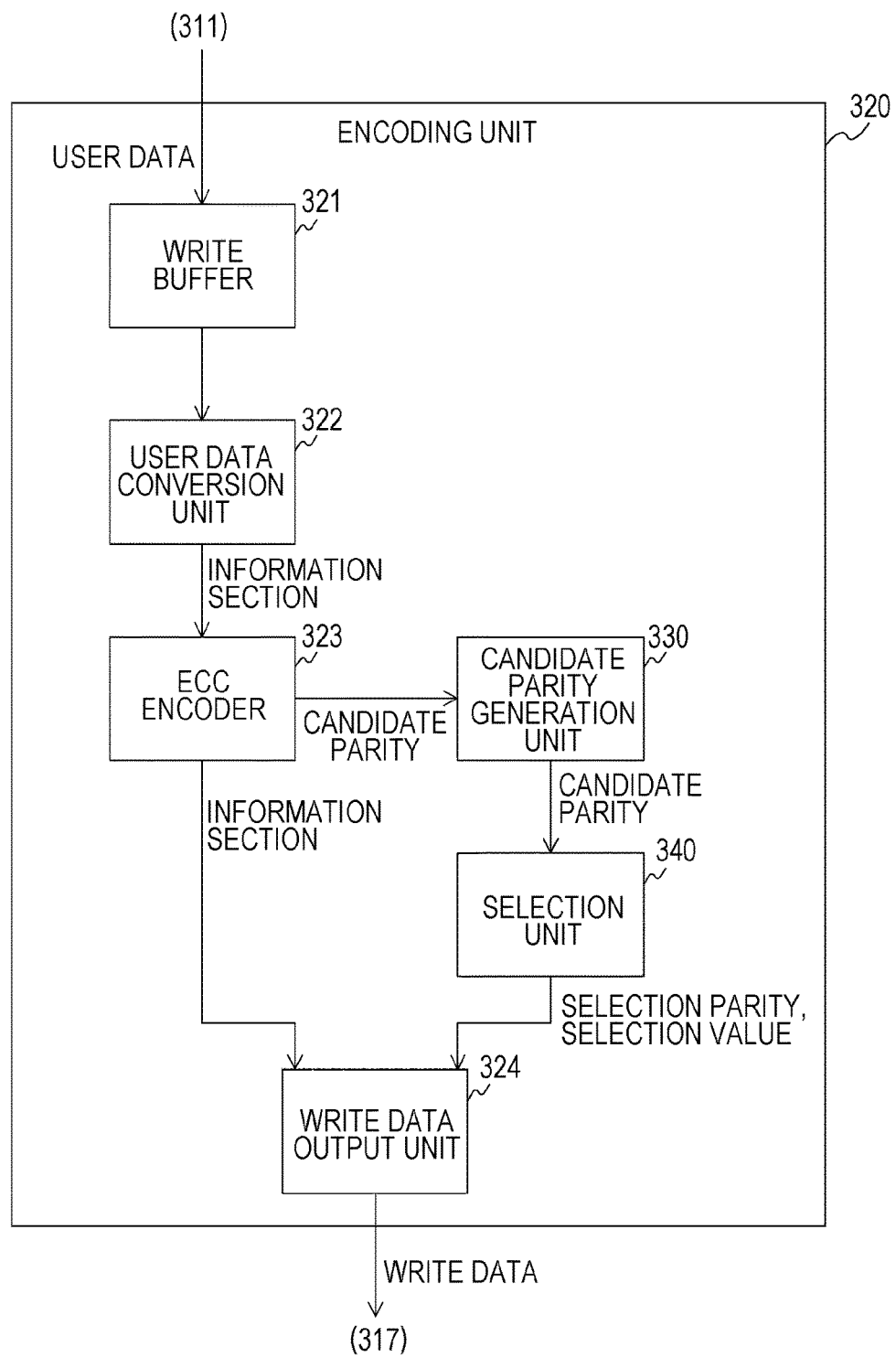
FIG. 7 is a block diagram illustrating a configuration example of an encoding unit in the first embodiment.

FIG. 7 is a block diagram illustrating a configuration example of the encoding unit 320 in the first embodiment. This encoding unit 320 is provided with a write buffer 321, a user data conversion unit 322, an ECC encoder 323, a candidate parity generation unit 330, a selection unit 340, and a write data output unit 324.

The write buffer 321 holds the user data from the host computer 100. The user data conversion unit 322 performs the conversion processing on the user data as necessary. For example, the user data conversion unit 322 performs processing of inverting at least a part of bits of the user data. For example, processing of inverting one-third or two-thirds bits of the user data or processing of inverting the whole thereof is performed. The user data conversion unit 322 counts a bit depth of "1" of the user data before inverting. Hereinafter, the bit depth of a specific value (for example, "1") in data is referred to as "weight" of this data. As described earlier, the retention of the memory cell holding "0" is better than that of the memory cell holding "1". Therefore, the encoding unit 320 determines whether to invert depending on whether the bit depth of "1" (that is, the weight) is to be reduced and additionally settles a portion to be inverted. By converting and writing the user data so as to reduce the weight, it is possible to improve the retention of the memory cell holding this user data.

The user data conversion unit 322 generates the reason data in which inversion bits indicating an inverted portion of the user data is saved and the unused data in which a predetermined selection value (for example, "00") is assigned and supplies, to the ECC encoder 323, the information section in which the above pieces of data and the user data are saved.

Note that, although the user data conversion unit 322 converts the user data by performing the inversion processing on at least a part of the user data, the conversion may be carried out by processing other than the inversion processing as long as the weight changes because of the processing. For example, the user data conversion unit 322 may perform processing of an exclusive OR (XOR) operation for each pair of bits corresponding between a predetermined fixed pattern and the user data.

The ECC encoder 323 encodes the information section. This ECC encoder 323 generates a codeword constituted by the information section and the parity using the generator polynomial G(x) of formula 2 and the information section. Then, the ECC encoder 323 supplies that information section to the write data output unit 324 and supplies the parity as a candidate parity C0 to the candidate parity generation unit 330. Note that the ECC encoder 323 is an example of a first candidate parity generation unit described in the claims.

The candidate parity generation unit 330 generates, as a candidate parity, a parity for detecting an error in the information section in which a part of data has been altered. This candidate parity generation unit 330 generates, as a candidate parity, a parity corresponding to the information section in which the selection value other than "00" (such as "01") is assigned in the unused data. For example, the candidate parity generation unit 330 generates the candidate parity for each of the information section with the selection value "01", the information section with the selection value "10", and the information section with the selection value "11". These candidate parities are specified as C1, C2 and C3. The candidate parity generation unit 330 supplies the candidate parity C0 from the ECC encoder 323 and the candidate parities C1, C2 and C3 generated by itself to the selection unit 340.

Note that the number of candidate parities generated by the candidate parity generation unit 330 is only required to be one or more and is not limited to three. The bit depth of the variable area in which the selection value is saved can be altered according to the number of candidate parities to be generated. For example, in a case where a 3-bit variable area is provided, the ECC encoder 323 and the candidate parity generation unit 330 can generate a total of eight candidate parities.

The selection unit 340 selects a parity that satisfies a predetermined condition from among the candidate parities C0, C1, C2, and C3. For each candidate parity, this selection unit 340 counts the weight of a combination constituted by the unused data corresponding to the candidate parity and the candidate parity to compare. Then, the selection unit 340 selects one having the smallest weight from among the combinations of the candidate parities and the unused data. The selection unit 340 supplies the candidate parity of the selected combination as a selection parity to the write data output unit 324 together with the selection value corresponding to this selection parity.

As described earlier, the retention of the memory cell holding "0" is better than that of the memory cell holding "1". Therefore, the encoding unit 320 selects the candidate parity and the unused data having the minimum bit depth of "1" (that is, the weight) to write, thereby being able to improve the retention of the memory cell holding these pieces of data.

Note that, although the selection unit 340 counts the bit depth of the value of "1" as "weight", the selection unit 340 may count the bit depth of the value of "0" as a weight.

The write data output unit 324 outputs the codeword constituted by the information section corresponding to the selection parity and the selection parity as write data. This write data output unit 324 updates the unused data in the information section with the selection value corresponding to the selection parity and outputs the codeword constituted by these information section and selection parity to the memory interface 317.

[Configuration Example of Candidate Parity Generation Unit]

Figure 8:
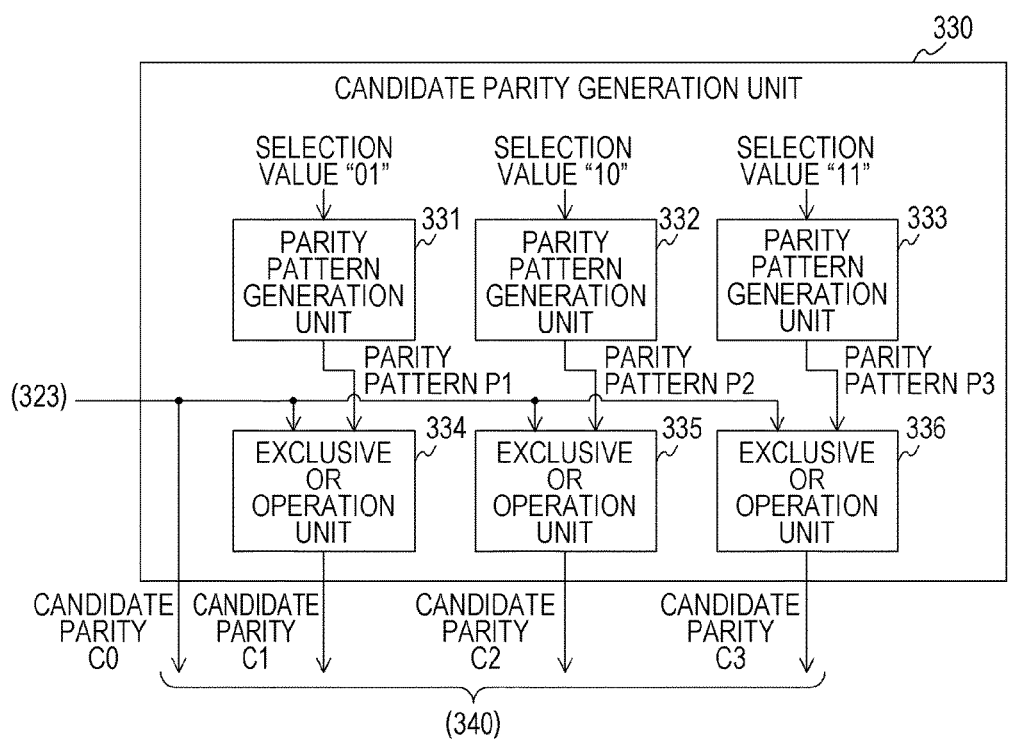
FIG. 8 is a block diagram illustrating a configuration example of a candidate parity generation unit in the first embodiment.

FIG. 8 is a block diagram illustrating a configuration example of the candidate parity generation unit 330 in the first embodiment. This candidate parity generation unit 330 is provided with parity pattern generation units 331, 332, and 333, and exclusive OR operation units 334, 335, and 336.

The parity pattern generation unit 331 generates a parity from the information section in which the selection value "01" is assigned to the unused data and "0" is assigned to all bits except the unused data. The parity is, for example, generated by the product of the information section and the generator polynomial G(x). This parity pattern generation unit 331 supplies the generated parity to the exclusive OR operation unit 334 as a parity pattern P1.

The parity pattern generation unit 332 generates a parity from the information section in which the selection value "10" is assigned to the unused data and "0" is assigned to all bits except the unused data. This parity pattern generation unit 332 supplies the generated parity to the exclusive OR operation unit 335 as a parity pattern P2.

The parity pattern generation unit 333 generates a parity from the information section in which the selection value "11" is assigned to the unused data and "0" is assigned to all bits except the unused data. This parity pattern generation unit 333 supplies the generated parity to the exclusive OR operation unit 336 as a parity pattern P3.

The exclusive OR operation unit 334 performs an exclusive OR (XOR) operation for each pair of bits corresponding between the candidate parity C0 and the parity pattern P1. This exclusive OR operation unit 334 supplies the operation result to the selection unit 340 as the candidate parity C1. Note that the exclusive OR operation unit 334 is an example of a second candidate parity generation unit described in the claims.

The exclusive OR operation unit 335 performs an XOR operation for each pair of bits corresponding between the candidate parity C0 and the parity pattern P2. This exclusive OR operation unit 335 supplies the operation result to the selection unit 340 as the candidate parity C2. Note that the exclusive OR operation unit 335 is an example of a third candidate parity generation unit described in the claims.

The exclusive OR operation unit 336 performs an XOR operation for each pair of bits corresponding between the candidate parity C0 and the parity pattern P3. This exclusive OR operation unit 336 supplies the operation result to the selection unit 340 as the candidate parity C3.

[Configuration Example of Selection Unit]

Figure 9:
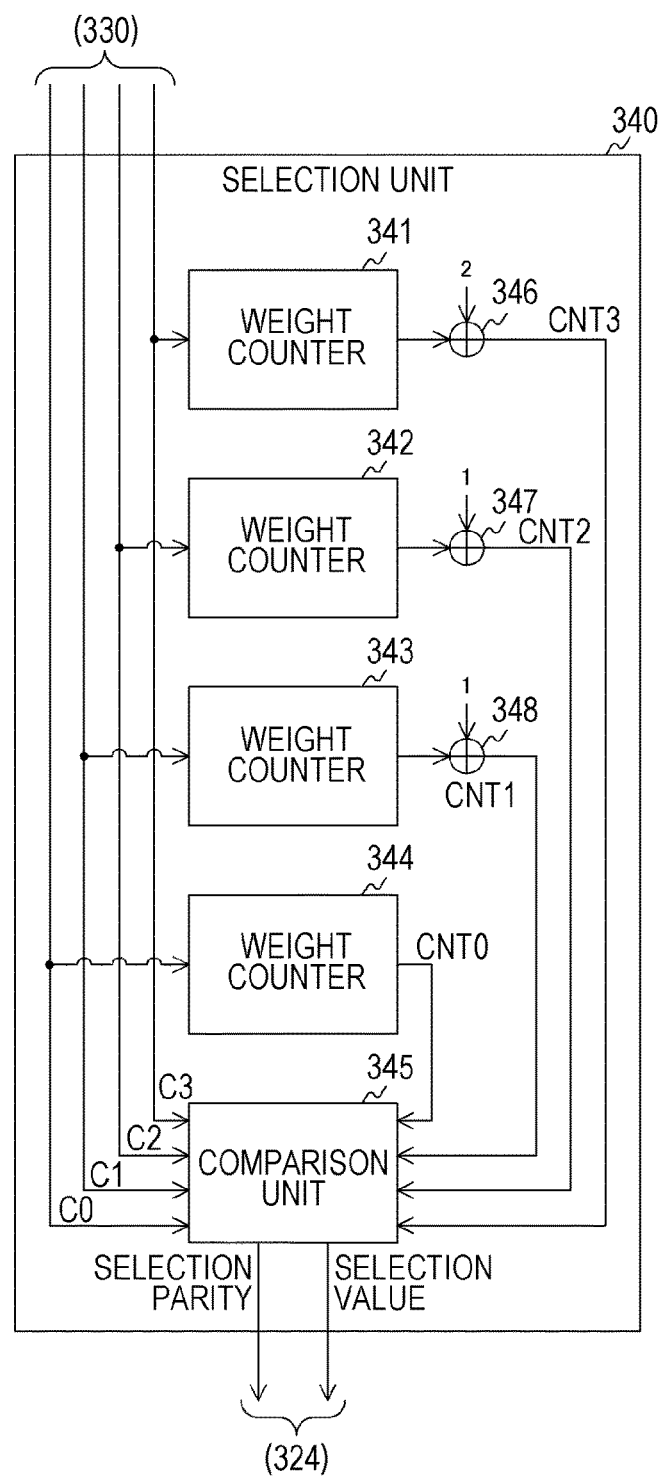
FIG. 9 is a block diagram illustrating a configuration example of a selection unit in the first embodiment.

FIG. 9 is a block diagram illustrating a configuration example of the selection unit 340 in the first embodiment. This selection unit 340 is provided with weight counters 341, 342, 343, and 344, adders 346, 347, and 348, and a comparison unit 345.

The weight counter 341 counts the number of "1" (weight) of the candidate parity C3. This weight counter 341 supplies a count value to the adder 346.

The adder 346 adds the number of weights (for example, "2") of the unused data corresponding to the candidate parity C3 to the count value of the weight of the candidate parity C3. This adder 346 supplies a count value CNT3 after the addition to the comparison unit 345.

The weight counter 342 counts the weight of the candidate parity C2. This weight counter 342 supplies a count value to the adder 347.

The adder 347 adds the number of weights (for example, "1") of the unused data corresponding to the candidate parity C2 to the count value of the weight of the candidate parity C2. This adder 347 supplies a count value CNT2 after the addition to the comparison unit 345.

The weight counter 343 counts the weight of the candidate parity C1. This weight counter 343 supplies a count value to the adder 348.

The adder 348 adds the number of weights (for example, "1") of the unused data corresponding to the candidate parity C1 to the count value of the weight of the candidate parity C1. This adder 348 supplies a count value CNT1 after the addition to the comparison unit 345. Note that the weight counter 343 and the adder 348 are an example of a second weight counter described in the claims.

The weight counter 344 counts the weight of the candidate parity C0. This weight counter 344 supplies a count value CNT0 to the comparison unit 345. Note that the weight counter 344 is an example of a first weight counter described in the claims.

The comparison unit 345 selects a candidate parity having the minimum corresponding weight (CNT0 to CNT3) from among the candidate parities C0 to C3 as the selection parity. The comparison unit 345 supplies the selection parity that has been selected and the selection value corresponding to this selection parity to the write data output unit 324.

[Configuration Example of Decoding Unit]

Figure 10:
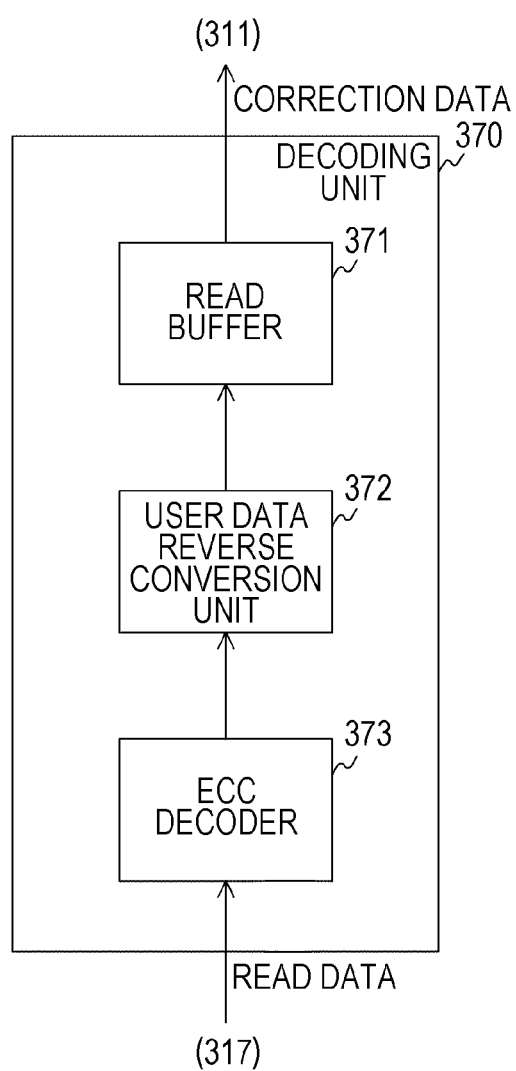
FIG. 10 is a block diagram illustrating a configuration example of a decoding unit in the first embodiment.

FIG. 10 is a block diagram illustrating a configuration example of the decoding unit 370 in the first embodiment. This decoding unit 370 is provided with a read buffer 371, a user data reverse conversion unit 372, and an ECC decoder 373.

The ECC decoder 373 reads the read data from the non-volatile memory 400 and decodes the read data using a decoding procedure corresponding to an encoding procedure of the encoding unit 320. This ECC decoder 373 supplies the decoded information section to the user data reverse conversion unit 372.

The user data reverse conversion unit 372 performs reverse conversion processing corresponding to the conversion processing of the encoding unit 320 on the user data in the information section. This user data reverse conversion unit 372 performs, as the reverse conversion processing, processing of, for example, inverting at least a part of the user data to return to the original data on the basis of the inversion bit in the management data in the information section. The user data reverse conversion unit 372 supplies the user data after the reverse conversion processing to the read buffer 371.

The read buffer 371 holds the user data from the user data reverse conversion unit 372 to supply to the system interface 311 as correction data.

Figure 11:
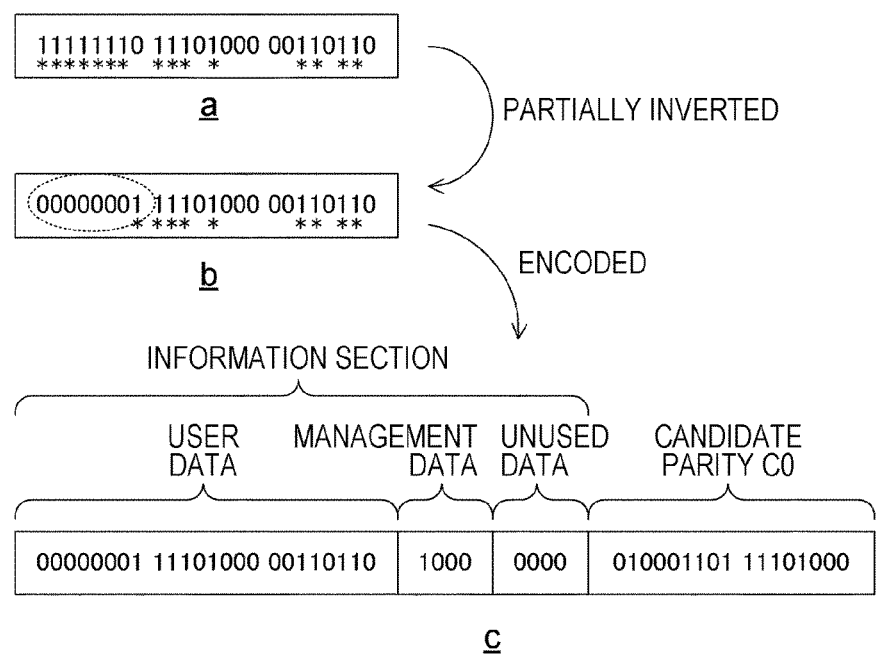
FIG. 11 is a diagram illustrating an example of user data and the codeword in the first embodiment.

FIG. 11 is a diagram illustrating an example of the user data and the codeword in the first embodiment. In FIG. 11, a indicates an example of the user data before inversion, while b of FIG. 11 indicates an example of the user data of which a part is inverted. "*" in FIG. 11 indicates the position of a bit having the value of "1". In addition, a portion surrounded by a dotted line in b of FIG. 11 indicates an inverted bit string. For example, 1 byte of 3-byte user data is inverted. With this configuration, the weight is reduced as exemplified in b of FIG. 11.

In FIG. 11, c is a diagram illustrating an example of the codeword in the first embodiment. Since 1 byte at a left end of the user data is inverted, the inversion bit with "1" indicating that a left end portion has been inverted is assigned to a left end bit of the management data. In addition, the selection value "00" is assigned in the unused data. The ECC encoder 323 generates an information section constituted by the above management data and unused data and the inverted user data and generates the candidate parity C0 from this information section.

Figure 12:
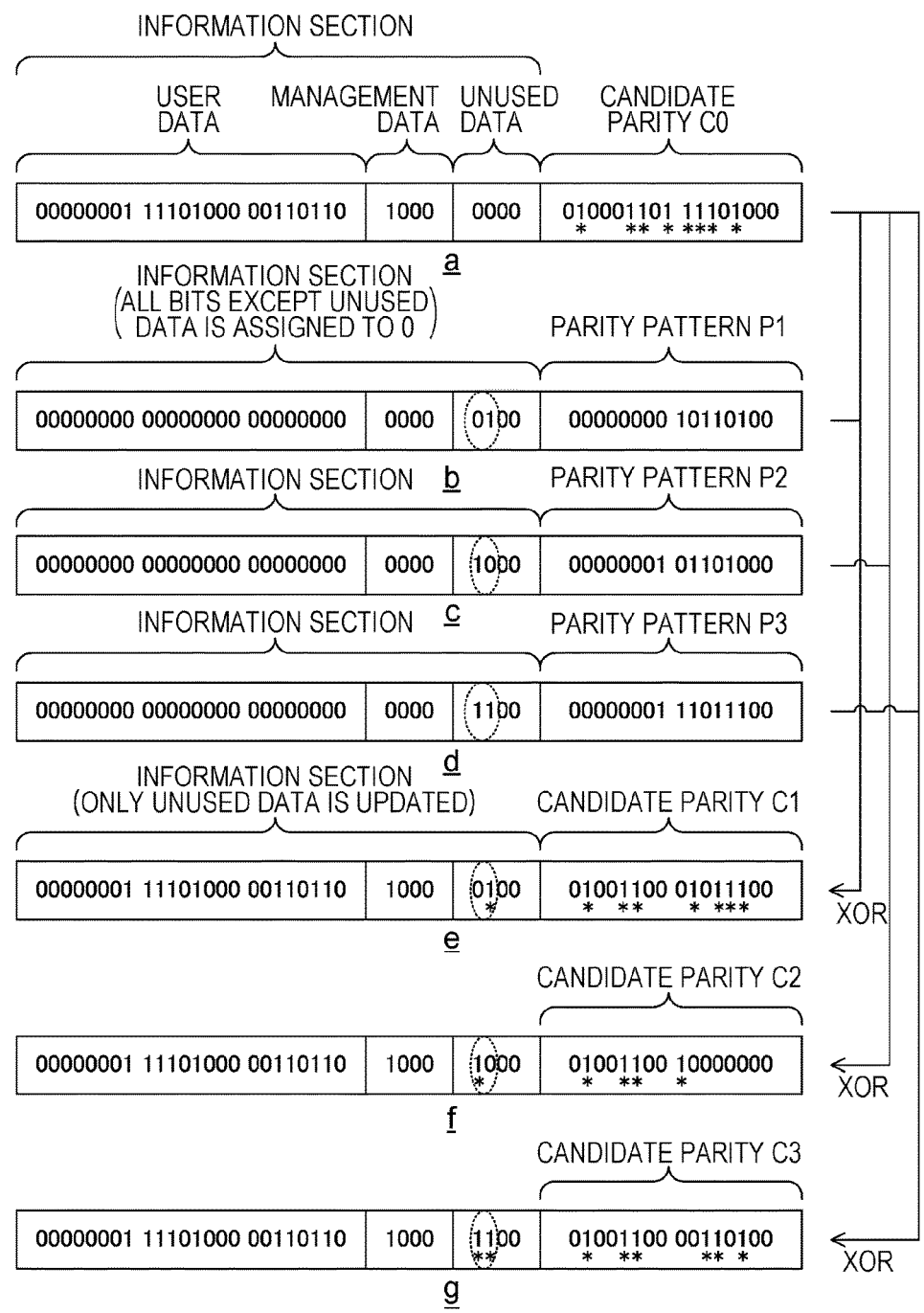
FIG. 12 is a diagram illustrating an example of an information section and candidate parities in the first embodiment.

FIG. 12 is a diagram illustrating an example of the information section and the candidate parities in the first embodiment. In FIG. 12, a indicates a codeword constituted by the user data, the unused data with the selection value "00", and the candidate parity C0.

The candidate parity generation unit 330 generates the parity patterns P1, P2, and P3 from the information section in which the selection values "01", "10", and "11" are assigned, respectively, and all other bits are assigned to "0".

In FIG. 12, b indicates a codeword including the parity pattern P1, while c of FIG. 12 indicates a codeword including the parity pattern P2. In addition, d of FIG. 12 indicates a codeword including the parity pattern P3. Then, the candidate parity generation unit 330 performs an XOR operation for each pair of bits corresponding between the candidate parity C0 and the parity patterns P1, P2 and P3 to generate the candidate parities C1, C2 and C3.

In FIG. 12, e indicates a codeword including the candidate parity C1, while f of FIG. 12 indicates a codeword including the candidate parity C2. In addition, g of FIG. 12 indicates a codeword including the candidate parity C3.

Here, in the linear block code such as the BCH code, it is known that a result of adding together codewords serves as a codeword in that code. Accordingly, a result of performing the XOR operation (in other words, addition) for each pair of bits corresponding between the codeword including the parity pattern P1 and the codeword including the candidate parity C0 serves as the codeword. Therefore, it is possible to detect and correct an error in the corresponding information section by the candidate parity C0 in that codeword of the addition result. Accordingly, the decoding unit 370 does not need to perform the XOR operation or the like on the selection parity and can perform decoding thereon as it is.

The candidate parity generation unit 330 then counts the weights of the candidate parities C0 to C3 and the corresponding selection values. "*" in FIG. 12 indicates the position of a counted bit. For example, the number of "*" (weight) of the candidate parity C0 and the selection value "00" is "8" in decimal number. In addition. The weight of the candidate parity C1 and the selection value "01" is "8" in decimal number and the weight of the candidate parity C2 and the selection value "10" is "5" in decimal number. The weight of the candidate parity C3 and the selection value "11" is "8" in decimal number.

The minimum value of these weights is "5" and the corresponding candidate parity C2 is selected. Note that, in a case where there are two or more candidate parities having the minimum weight, any one of these candidate parities is arbitrarily selected.

In a configuration in which the parity and the unused data are written as they are like a general memory controller, it is not possible to improve the retention of a memory cell to which these items are written. However, as exemplified in FIG. 12, the encoding unit 320 generates a plurality of candidate parities by altering a part of the information section (that is, the unused data) and selects a parity having the minimum weight from thereamong. Therefore, the weight of a memory cell to which the parity and the unused data are written becomes smaller. For example, in the example in FIG. 12, it is possible to reduce the weight from "8" to "5". With this configuration, the retention of the memory cell can be improved.

Note that, although the candidate parities C1 to C3 are generated by the generation and the XOR operation of the parity patterns, the generation of the candidate parities C1 to C3 is not limited to this configuration. For example, the encoding unit 320 may generate the candidate parity C1 and so on by the product of the information section in e to g of FIG. 12 in which only the unused data is altered and the generator polynomial G(x). However, the case of generating a parity pattern and performing the XOR operation thereon only needs a smaller amount of operation. For example, in a case where a parity pattern is generated from an information section in which all bits except the unused data in the information section are specified as "0", the amount of operation is decreased as compared with a case where the user data is saved therein because data other than the unused data has "0". Furthermore, the XOR operation is additionally performed but, even if this operation is taken into consideration, the total amount of operation is reduced. Accordingly, it is desirable that the encoding unit 320 generate the candidate parity C1 and so on by generating parity patterns and performing the XOR operations thereon.

In addition, although the encoding unit 320 converts the user data, the encoding unit 320 may encode the user data as it is without performing the conversion thereon. In this case, the decoding unit 370 performs only decoding without performing the reverse conversion.

Meanwhile, although the encoding unit 320 is provided in the memory system, the encoding unit 320 may be provided in a system other than the memory system as long as the system is a system that performs encoding (communication system). For example, in a communication system whose power consumption is further reduced by transmitting a low-level bit than the case of transmitting a high-level bit, the power consumption can be reduced when the encoding unit 320 selects a parity having the minimum weight.

[Configuration Example of Non-Volatile Memory]

Figure 13:
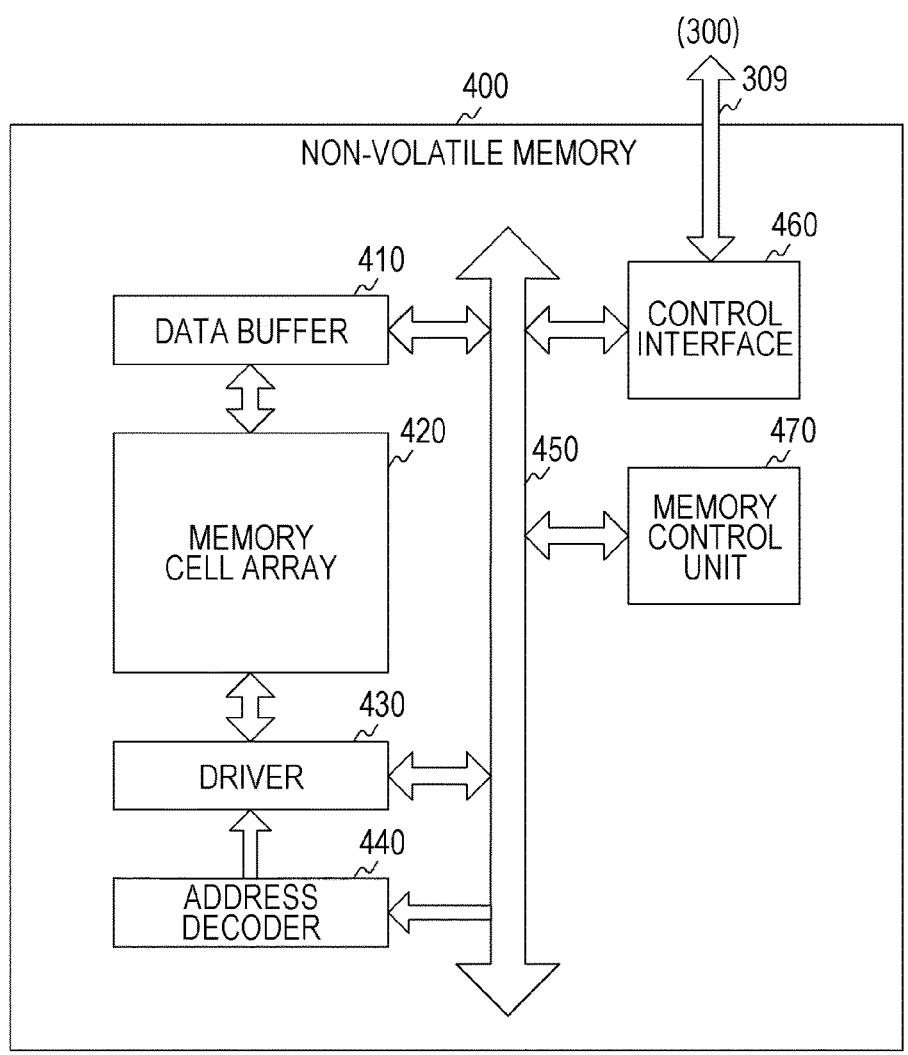
FIG. 13 is a block diagram illustrating one configuration of a non-volatile memory in the first embodiment.

FIG. 13 is a block diagram illustrating a configuration example of the non-volatile memory 400 in the first embodiment. This non-volatile memory 400 is provided with a data buffer 410, a memory cell array 420, a driver 430, an address decoder 440, a bus 450, a control interface 460, and a memory control unit 470.

The data buffer 410 holds the write data and the read data in access units in accordance with the control of the memory control unit 470. The memory cell array 420 is provided with a plurality of memory cells arranged in a matrix form.

A non-volatile storage element such as the ReRAM is used as each memory cell.

The driver 430 writes data to or reads data from a memory cell selected by the address decoder 440. The address decoder 440 analyzes an address designated by a command and selects a memory cell corresponding to this address. The bus 450 is a common path for the data buffer 410, the memory cell array 420, the address decoder 440, the memory control unit 470, and the control interface 460 to mutually exchange data. The control interface 460 is an interface for the memory controller 300 and the non-volatile memory 400 to mutually exchange data and a command.

The memory control unit 470 controls the driver 430 and the address decoder 440 to write or read data. In the case of receiving a control signal instructing the writing and the write data, the memory control unit 470 reads data written in an address designated by this control signal as pre-read data. The memory control unit 470 compares the write data with the pre-read data on a bit basis and specifies a bit having "1" in the write data and having "0" in the pre-read data as a target to be rewritten. The memory control unit 470 rewrites these bits to be rewritten to "1". Next, the memory control unit 470 compares the write data with the pre-read data after set processing on a bit basis and specifies a bit having "0" in the write data and having "1" in the pre-read data as a target to be rewritten. The memory control unit 470 rewrites these bits to be rewritten to "0".

Meanwhile, upon receiving a control signal instructing the reading, the memory control unit 470 controls the address decoder 440 and the driver 430 to output the read data to the memory controller 300.

[Action Example of Storage]

Figure 14:
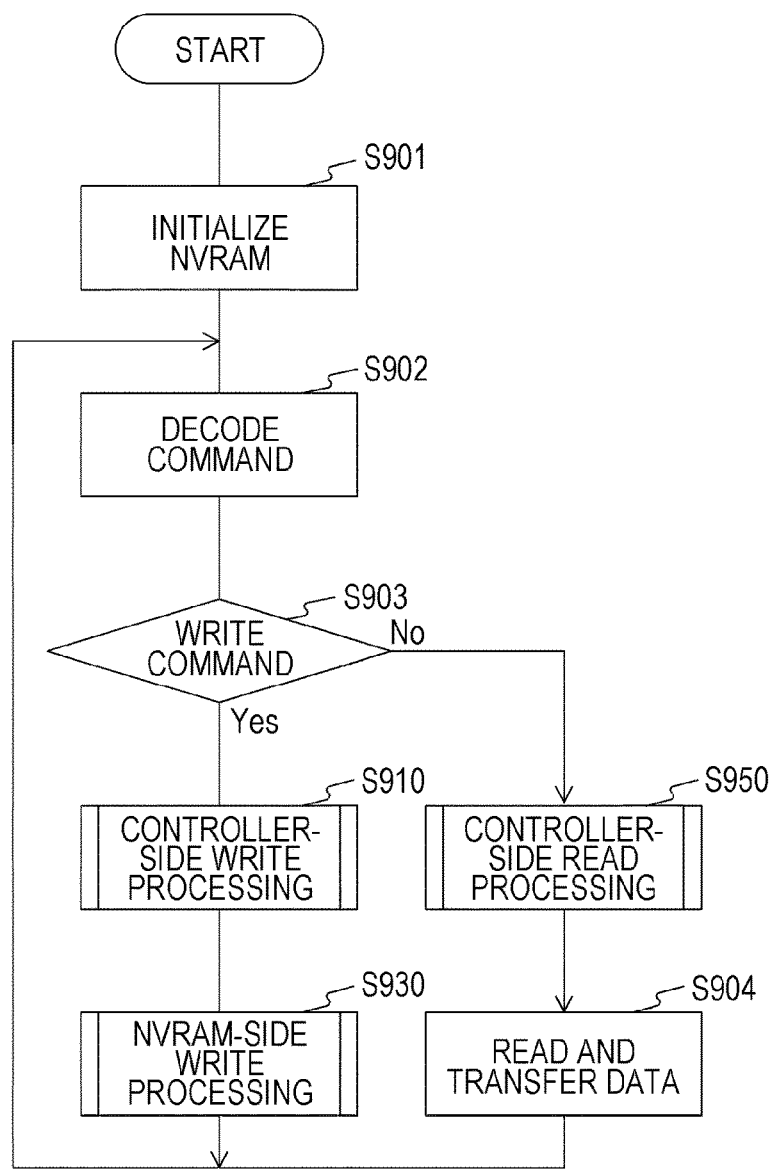
FIG. 14 is a flowchart illustrating an example of the action of a storage in the first embodiment.

FIG. 14 is a flowchart illustrating an example of the action of the storage 200 in the first embodiment. This action starts, for example, when the storage 200 is instructed by the host computer 100 to initialize itself.

The non-volatile memory 400 initializes the memory cell array 420 (step S901). The memory controller 300 decodes a command from the host computer 100 (step S902). In a case where a command is received from the host computer 100, the memory controller 300 determines whether this command is a write command (step S903). It is assumed here that the command from the host computer 100 is one of the write command and the read command.

In a case where the command is a write command (step S903: Yes), the memory controller 300 executes controller-side write processing (step S910). Then, the non-volatile memory 400 executes NVRAM-side write processing (step S930).

On the other hand, in a case where the command is a read command (step S903: No), the memory controller 300 executes controller-side read processing (step S950). Then, the non-volatile memory 400 reads data to transfers to the memory controller 300 (step S904). After step S930 or S904, the storage 200 returns to step S902.

Figure 15:
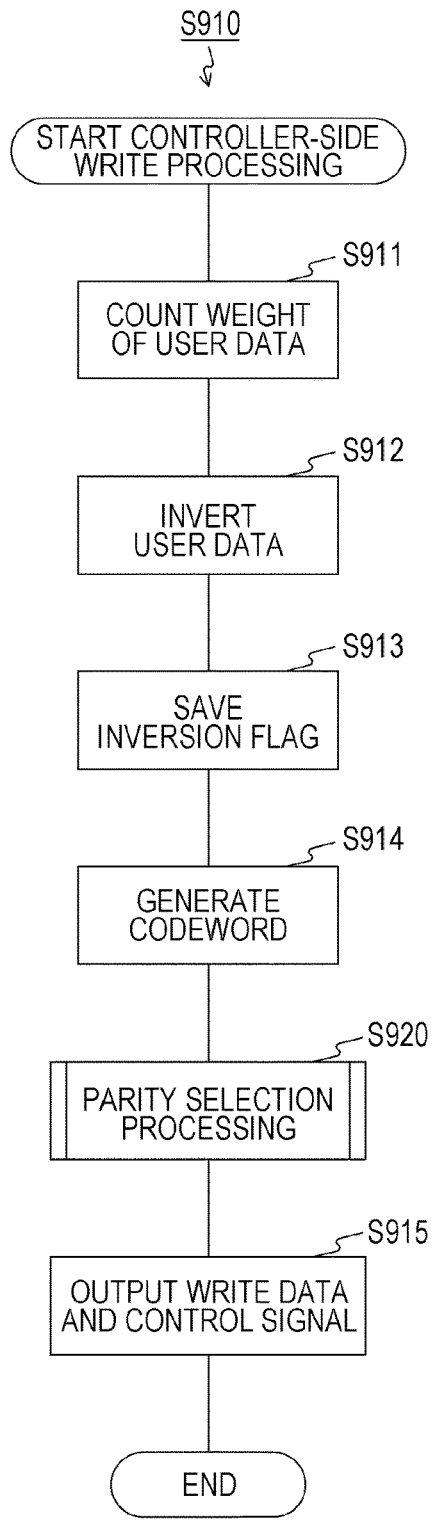
FIG. 15 is a flowchart illustrating an example of controller-side write processing in the first embodiment.

FIG. 15 is a flowchart illustrating an example of the controller-side write processing in the first embodiment. The memory controller 300 counts the weight of the user data (step S911) and inverts at least a part of the user data on the basis of the count value (step S912). The memory controller 300 saves an inversion flag to the management data (step S913) and encodes the information section including the user data after inversion processing into a codeword constituted by this information section and the candidate parity C0 (step S914).

The memory controller 300 executes parity selection processing of selecting one of the plurality of candidate parities (step S920). Then, the memory controller 300 outputs the write data including the selection parity and the corresponding information section to the non-volatile memory 400 (step S915) and ends the controller-side write processing.

Figure 16:
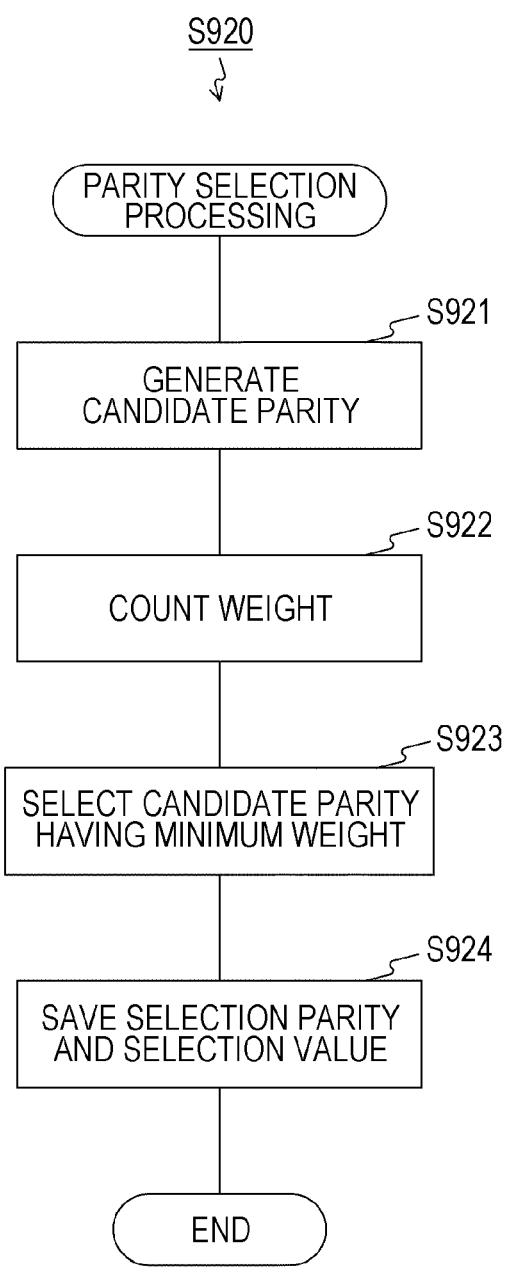
FIG. 16 is a flowchart illustrating an example of parity selection processing in the first embodiment.

FIG. 16 is a flowchart illustrating an example of the parity selection processing in the first embodiment. The memory controller 300 generates a candidate parity for each selection value (step S921) and counts the weight for each candidate parity (step S922). The memory controller 300 selects a candidate parity having the minimum weight (step S923) and saves the selection parity and the corresponding selection value to the codeword (step S924). After step S924, the memory controller 300 ends the parity selection processing.

Figure 17:
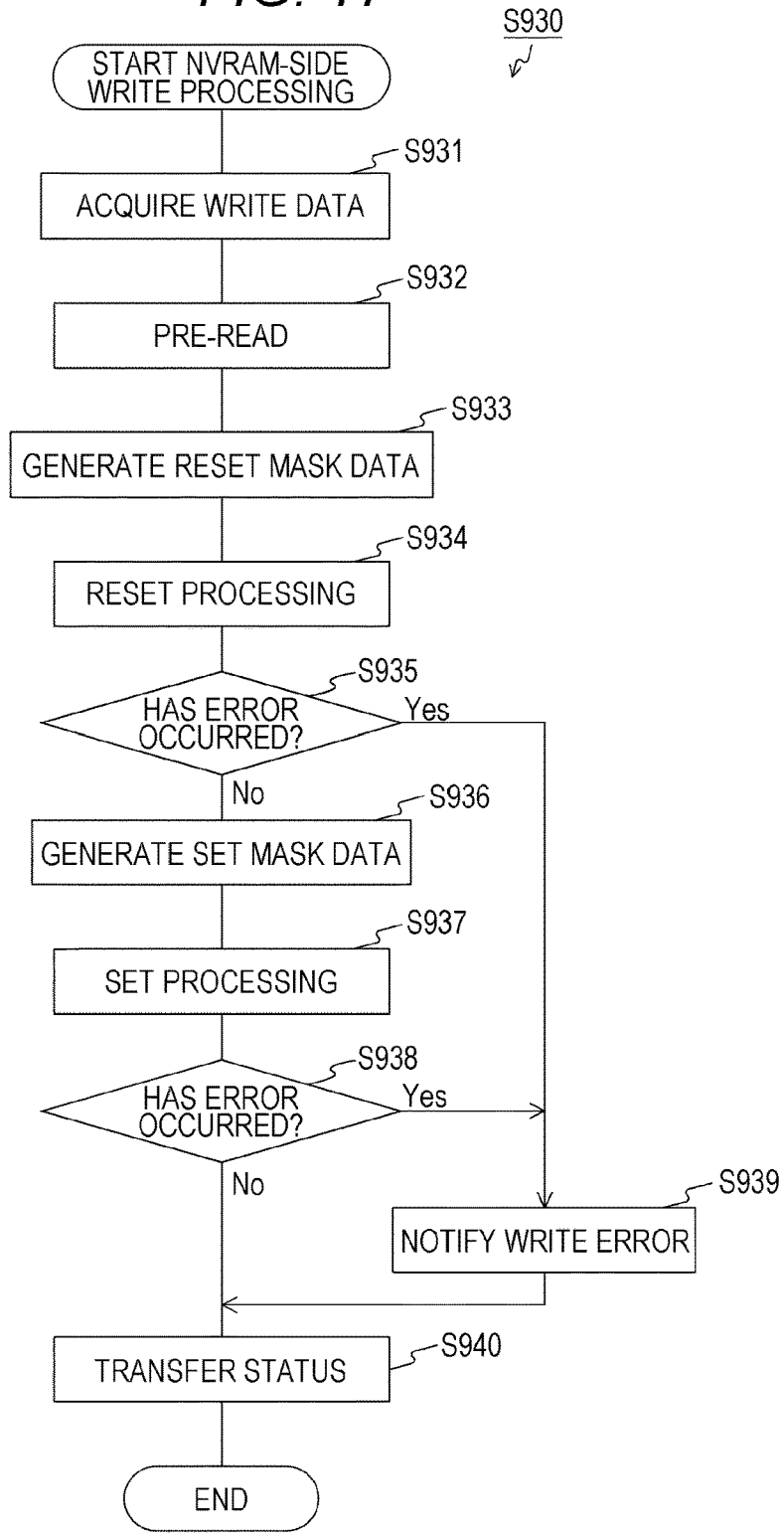
FIG. 17 is a flowchart illustrating an example of NVRAM-side write processing in the first embodiment.

FIG. 17 is a flowchart illustrating an example of the NVRAM-side write processing in the first embodiment. The non-volatile memory 400 acquires the write data (step S931). The non-volatile memory 400 pre-reads data written in a write destination address (step S932). The non-volatile memory 400 compares bits corresponding between the write data and the pre-read data to generate reset mask data (step S933). This reset mask data indicates that resetting is performed for a bit having "0" in the write data and "1" in the pre-read data and masking is performed for other bits.

The non-volatile memory 400 performs processing (reset processing) of rewriting only a bit indicated by the reset mask data to be reset from "1" to "0" (step S934). The non-volatile memory 400 reads the pre-read data after the reset processing and determines whether a verify error has arisen (step S935).

In a case where no verify error has arisen (step S935: No), the non-volatile memory 400 compares bits corresponding between the write data and the pre-read data after the reset processing to generate set mask data (step S936). This set mask data indicates that setting is performed for a bit having "1" in the write data and "0" in the pre-read data and masking is performed for other bits.

The non-volatile memory 400 performs processing (set processing) of rewriting only a bit indicated by the set mask data to be set from "0" to "1" (step S937). The non-volatile memory 400 reads the pre-read data after the set processing and determines whether a verify error has arisen (step S938).

In a case where an error has occurred during the reset processing (step S935: Yes), or in a case where an error has occurred during the set processing (step S938: Yes), the non-volatile memory 400 notifies the host computer 100 of a write error (step S939). In a case where no error has occurred during the set processing (step S938: No), or after step S939, the non-volatile memory 400 transfers the status to the memory controller 300 (step S940). After step S940, the non-volatile memory 400 ends the NVRAM-side write processing.

Figure 18:
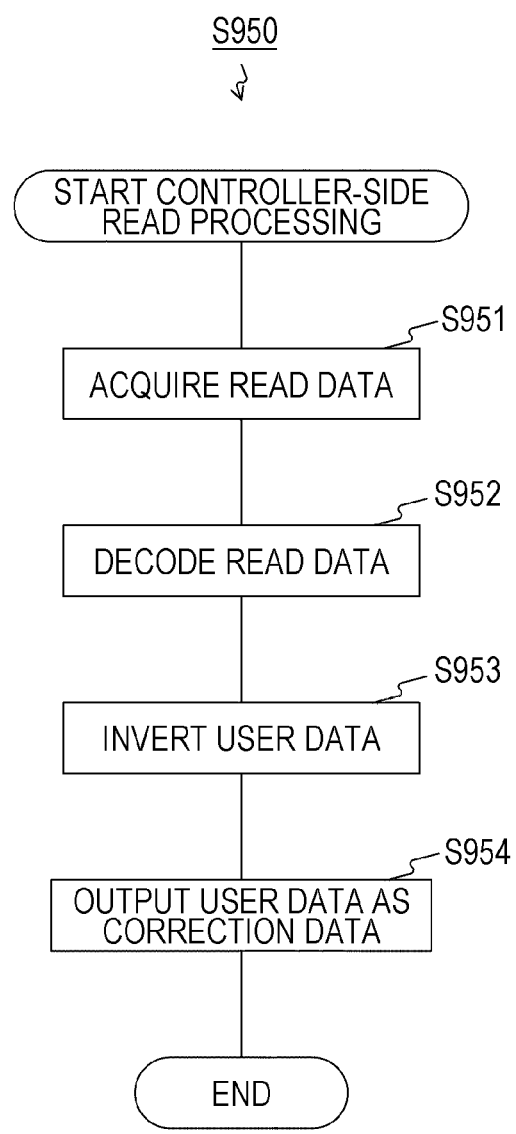
FIG. 18 is a flowchart illustrating an example of controller-side read processing in the first embodiment.

FIG. 18 is a flowchart illustrating an example of the controller-side read processing in the first embodiment. The memory controller 300 acquires the read data (step S951) to decode (step S952). The memory controller 300 inverts the user data on the basis of the management data (step S953). The memory controller 300 outputs the user data as correction data to the host computer 100 (step S954) and ends the controller-side read processing.

As described above, according to the first embodiment of the present technology, the encoding unit 320 assigns a plurality of different values in the variable area in the information section to generate candidate parities and selects a parity having the minimum weight from among these candidate parities, thereby being able to improve the data holding characteristic of the memory cell.

[Modification]

In the first embodiment described above, the candidate parity generation unit 330 generates a parity pattern by a matrix operation but there is a fear that the amount of operation will increase as the data size of the codeword becomes larger. A candidate parity generation unit 330 in this modification of the first embodiment is different from the candidate parity generation unit in the first embodiment in that the amount of operation is reduced.

Figure 19:
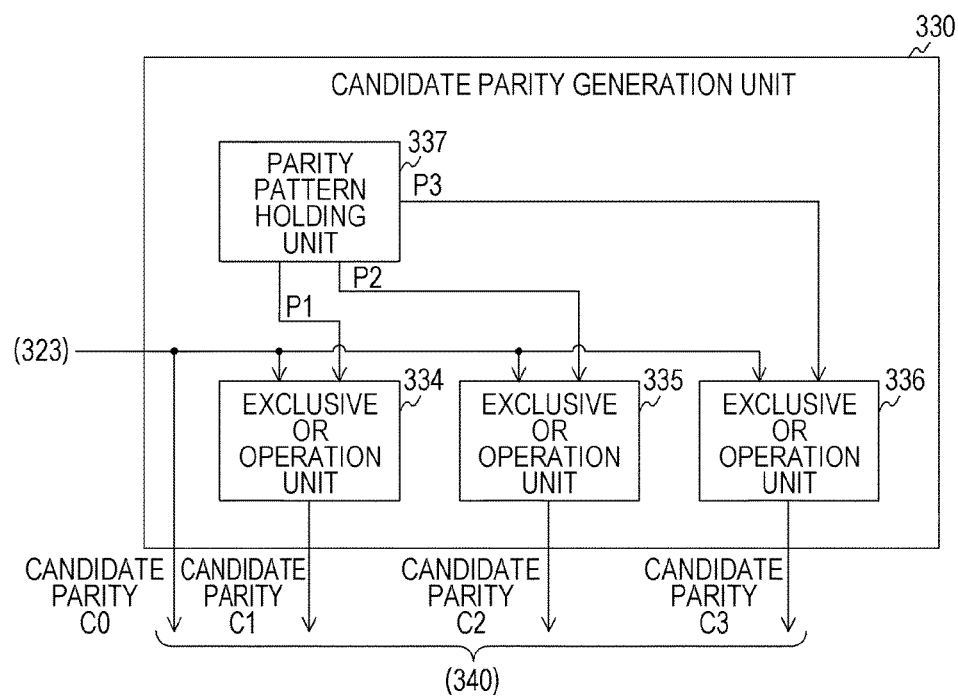
FIG. 19 is a block diagram illustrating a configuration example of a candidate parity generation unit in a modification of the first embodiment.

FIG. 19 is a block diagram illustrating a configuration example of a candidate parity generation unit 330 in the modification of the first embodiment. The candidate parity generation unit 330 of this modification is different from the candidate parity generation unit of the first embodiment in that a parity pattern holding unit 337 is provided instead of the parity pattern generation units 331, 332, and 333.

The parity pattern holding unit 337 holds the parity patterns (such as P1, P2, and P3) obtained by an operation performed in advance for each selection value. These parity patterns. Read by respective exclusive OR operation units 334, 335 and 336.

As described above, according to the modification of the first embodiment of the present technology, since the parity pattern obtained by an operation performed in advance is held, it becomes unnecessary for the candidate parity generation unit 330 to perform a matrix operation for finding a parity pattern.

2. Second Embodiment

In the first embodiment described above, the memory controller 300 selects the candidate parity having the minimum weight as the selection parity. However, in a case where the bit depth to be rewritten grows due to the selection parity, there is a fear that the retention of the memory cell cannot be sufficiently improved. Therefore, it is desirable to reduce the bit depth to be rewritten. A memory controller 300 of this second embodiment is different from the memory controller of the first embodiment in that the bit depth to be rewritten is reduced.

Figure 20:
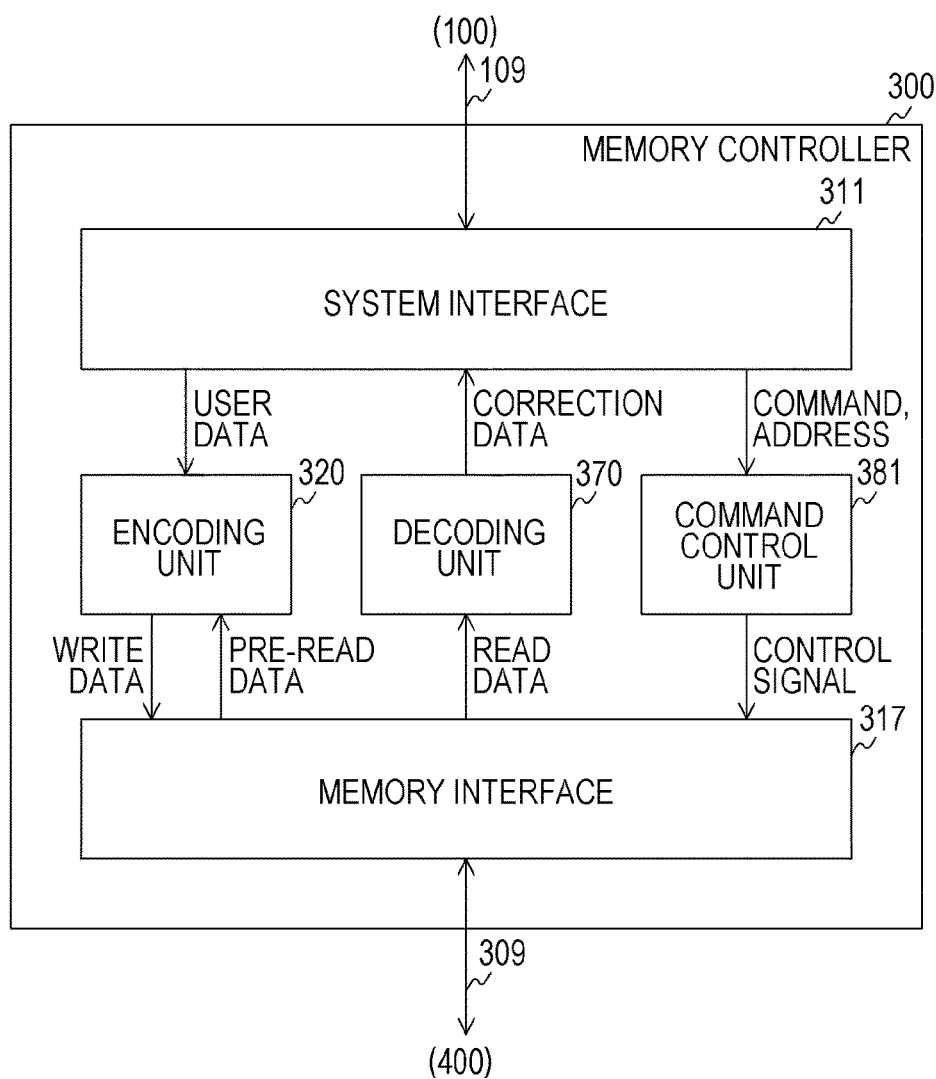
FIG. 20 is a block diagram illustrating a functional configuration example of a memory controller in a second embodiment.

FIG. 20 is a block diagram illustrating a functional configuration example of the memory controller 300 in the second embodiment. The memory controller 300 of this second embodiment is different from the memory controller of the first embodiment in that a command control unit 381 is provided instead of the command control unit 380.

Upon receiving the write command, the command control unit 381 generates a control signal requesting the writing and the outputting of the pre-read data to supply to a non-volatile memory 400. In accordance with this control signal, the memory controller 300 outputs, to the memory controller 300, the pre-read data of the write data before writing. An encoding unit 320 compares this pre-read data with the codeword on a bit basis and generates write data having the minimum bit depth to be rewritten.

Figure 21:
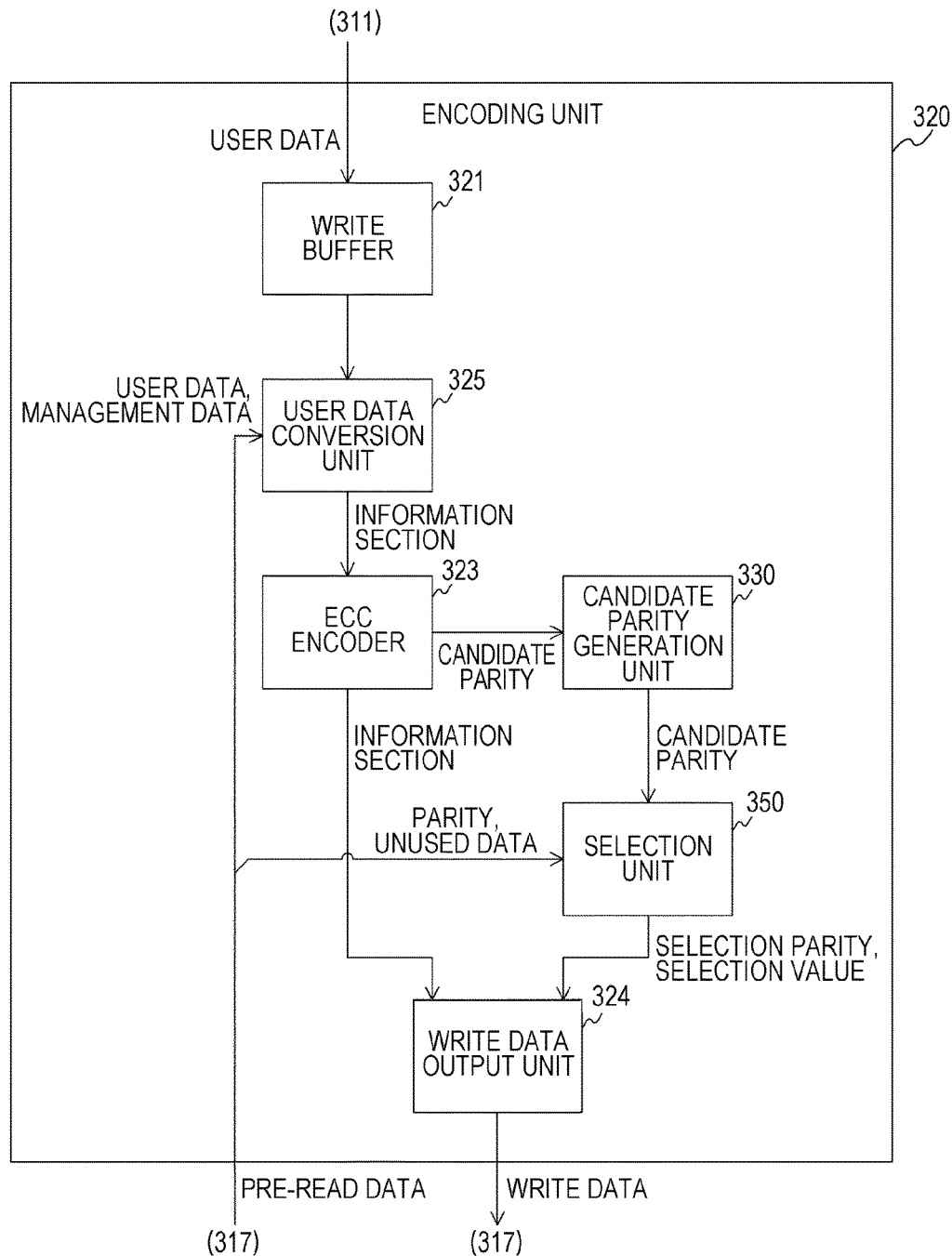
FIG. 21 is a block diagram illustrating a configuration example of an encoding unit in the second embodiment.

FIG. 21 is a block diagram illustrating a configuration example of the encoding unit 320 in the second embodiment. The encoding unit 320 of this second embodiment is different from the encoding unit of the first embodiment in that a user data conversion unit 325 and a selection unit 350 are provided instead of the user data conversion unit 322 and the selection unit 340.

The user data conversion unit 325 acquires a combination constituted by the user data and the management data in the pre-read. Then, the user data conversion unit 325 counts, in the user data and the management data before the inversion, the number of bits having different values from those of the corresponding bits in the pre-read data. The user data conversion unit 325 performs the inversion processing so as to minimize a rewrite bit depth on the basis of the above count value and supplies the information section including that user data after the inversion processing to an ECC encoder 323.

In addition, the selection unit 350 acquires a combination constituted by the unused data and the parity in the pre-read. Then, the user data conversion unit 325 counts, for each combination constituted by the candidate parity and the unused data, the number of bits having different values from those of the corresponding bits in the pre-read data. The user data conversion unit 325 selects a candidate parity of a combination having the minimum count value (that is, the bit depth to be rewritten).

Figure 22:
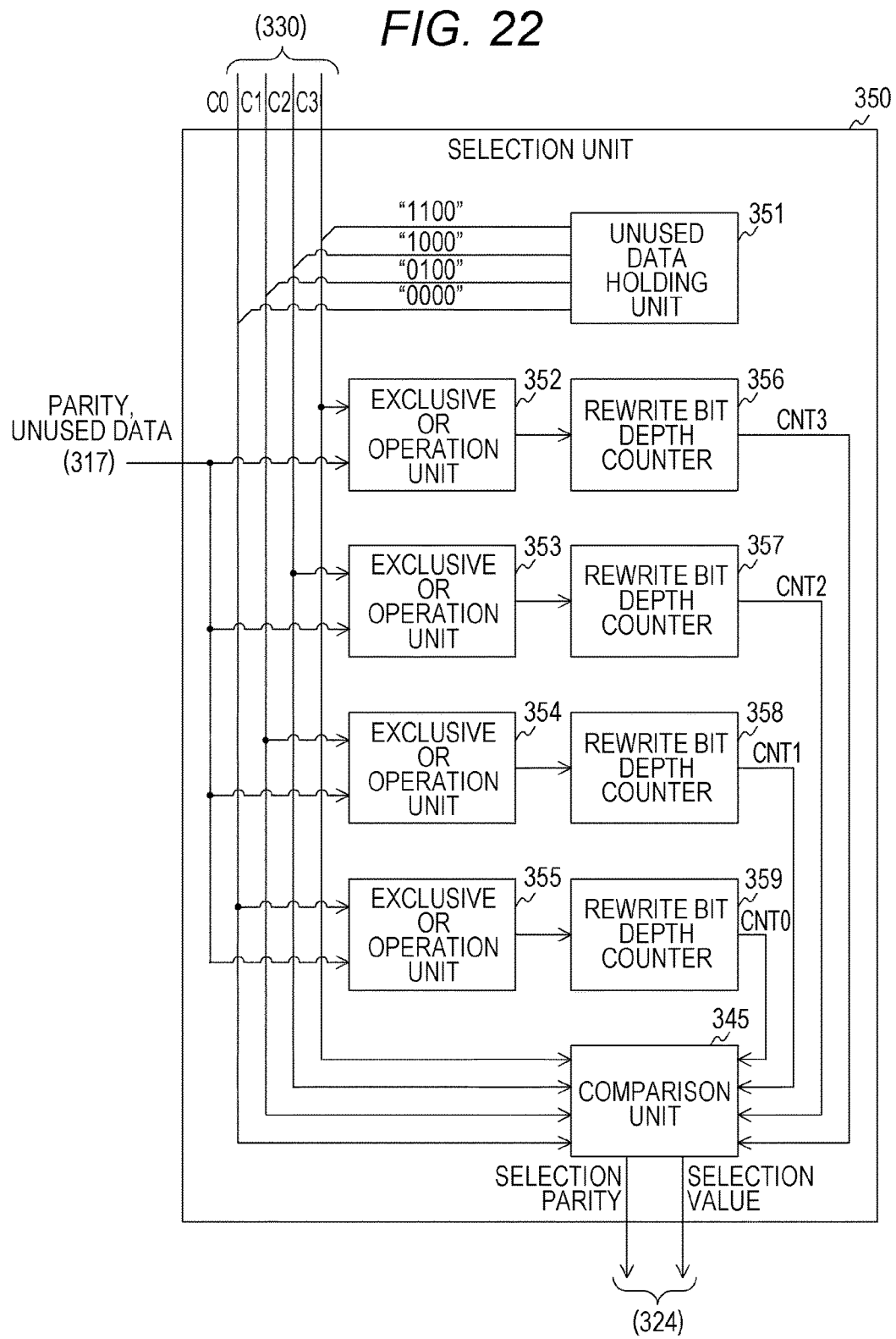
FIG. 22 is a block diagram illustrating a configuration example of a selection unit in the second embodiment.

FIG. 22 is a block diagram illustrating a configuration example of the selection unit 350 in the second embodiment. This selection unit 350 is provided with an unused data holding unit 351, exclusive OR operation units 352 to 355, rewrite bit depth counters 356 to 359, and a comparison unit 345.

The unused data holding unit 351 holds a plurality of pieces of the unused data in which different selection values are assigned. These pieces of the unused data are read by the exclusive OR operation units 352 to 355.

The exclusive OR operation unit 352 performs an XOR operation for each pair of bits corresponding between the parity and the unused data in the pre-read data and the candidate parity C3 and the corresponding unused data, respectively. As unused data corresponding to the candidate parity C3, "1100" is read from the unused data holding unit 351. The exclusive OR operation unit 352 supplies an operation result to the rewrite bit depth counter 356.

The exclusive OR operation unit 353 performs an XOR operation for each pair of bits corresponding between the data in the pre-read data and the candidate parity C2 and corresponding unused data "1000". This exclusive OR operation unit 353 supplies an operation result to the rewrite bit depth counter 357.

The exclusive OR operation unit 354 performs an XOR operation for each pair of bits corresponding between the data in the pre-read data and the candidate parity C1 and corresponding unused data "0100". This exclusive OR operation unit 354 supplies an operation result to the rewrite bit depth counter 358.

The exclusive OR operation unit 355 performs an XOR operation for each pair of bits corresponding between the data in the pre-read data and the candidate parity C0 and corresponding unused data "0000". This exclusive OR operation unit 355 supplies an operation result to the rewrite bit depth counter 359.

The rewrite bit depth counter 356 counts the number of "1" in the operation result of the exclusive OR operation unit 352 as the rewrite bit depth. This rewrite bit depth counter 356 supplies the count value CNT3 to the comparison unit 345.

The rewrite bit depth counter 357 counts the number of "1" in the operation result of the exclusive OR operation unit 353 as the rewrite bit depth. This rewrite bit depth counter 357 supplies the count value CNT2 to the comparison unit 345.

The rewrite bit depth counter 358 counts the number of "1" in the operation result of the exclusive OR operation unit 354 as the rewrite bit depth. This rewrite bit depth counter 358 supplies the count value CNT1 to the comparison unit 345.

The rewrite bit depth counter 359 counts the number of "1" in the operation result of the exclusive OR operation unit 355 as the rewrite bit depth. This rewrite bit depth counter 359 supplies the count value CNT0 to the comparison unit 345. The configuration of the comparison unit 345 of the second embodiment is similar to that of the first embodiment.

Figure 23:
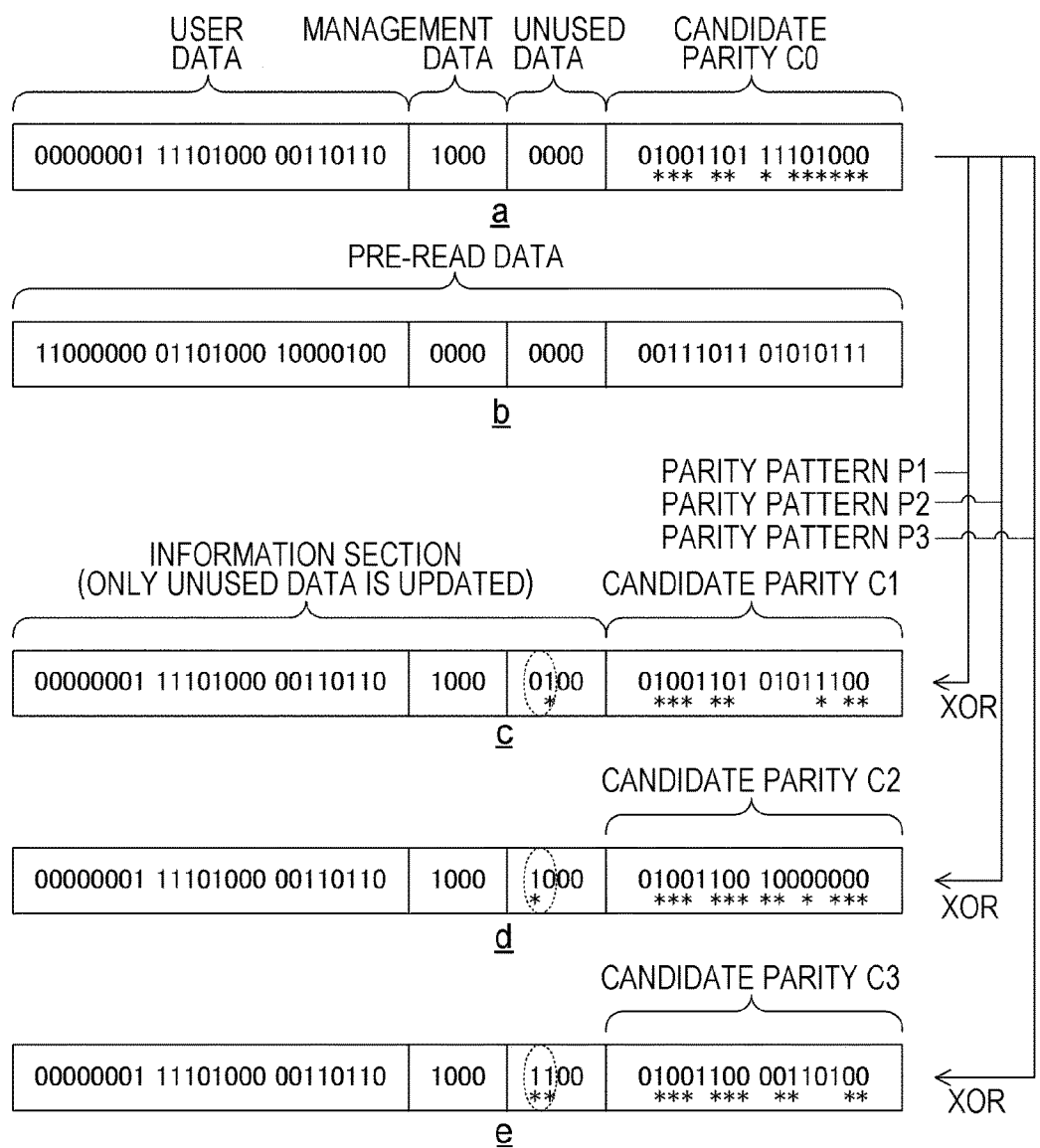
FIG. 23 is a diagram illustrating an example of an information section and candidate parities in the second embodiment.

FIG. 23 is a diagram illustrating an example of the information section and the candidate parities in the second embodiment. In FIG. 23, a indicates a codeword constituted by the user data, the unused data with the selection value "00", and the candidate parity C0. In FIG. 23, b is a diagram illustrating an example of the pre-read data. Meanwhile, c of FIG. 22 indicates a codeword including the candidate parity C1 and d of FIG. 22 indicates a codeword including the candidate parity C2. In addition, e of FIG. 23 indicates a codeword including the candidate parity C3.

A candidate parity generation unit 330 compares the parity and the unused data in the pre-read data with the candidate parity and the corresponding unused data on a bit basis. From a result of this comparison, the candidate parity generation unit 330 finds the rewrite bit depth for each candidate parity.

In FIG. 23, "*" indicates the position of a rewrite bit. For example, the rewrite bit depth in the candidate parity C0 and the unused data "0000" is "12" in decimal number. The rewrite bit depth in the candidate parity C1 and the unused data "0100" is "9" in decimal number and the rewrite bit depth in the candidate parity C2 and the unused data "1000" is "13" in decimal number. The rewrite bit depth in the candidate parity C3 and the unused data "1100" is "12" in decimal number. The candidate parity C2 having the minimum rewrite bit depth is selected from among these candidate parities. With this configuration, the rewrite bit depth of the memory cell is reduced and the retention of the memory cell can be improved.

Figure 24:
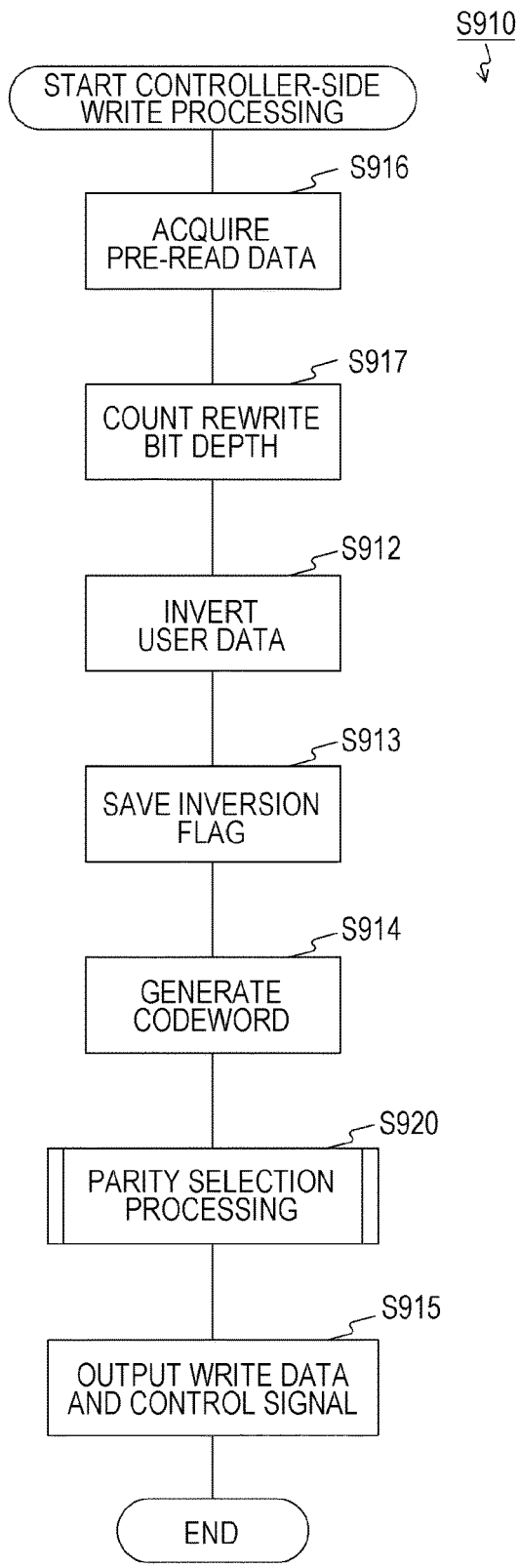
FIG. 24 is a flowchart illustrating an example of controller-side write processing in the second embodiment.

FIG. 24 is a flowchart illustrating an example of controller-side write processing in the second embodiment. This controller-side write processing of the second embodiment is different from the controller-side write processing of the first embodiment in that steps S916 and S917 are executed instead of step S911.

The memory controller 300 acquires the pre-read data (step S916) and counts the rewrite bit depth for the user data before inversion (step S917). After step S917, the memory controller 300 executes step S912 and subsequent steps.

Figure 25:
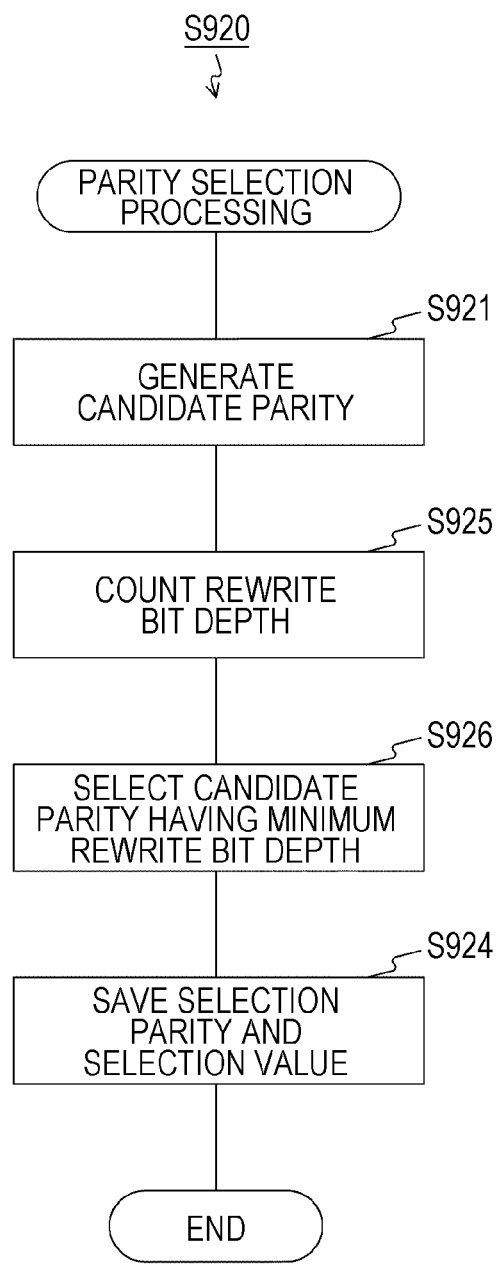
FIG. 25 is a flowchart illustrating an example of parity selection processing in the second embodiment.

FIG. 25 is a flowchart illustrating an example of parity selection processing in the second embodiment. The parity selection processing of the second embodiment is different from the parity selection processing of the first embodiment in that steps S925 and S926 are executed instead of steps S922 and S923.

The memory controller 300 generates candidate parities (step S921) and counts the rewrite bit depth for each candidate parity (step S925). The memory controller 300 selects a candidate parity having the minimum rewrite bit depth (step S926) and executes step S924.

As described above, according to the second embodiment of the present technology, the encoding unit 320 selects the parity having the minimum rewrite bit depth from among the candidate parities, thereby being able to reduce the rewrite bit depth of the memory cell and improve the data holding characteristic of the memory cell.

3. Third Embodiment

In the first embodiment described above, data is arranged in the order of the parity, the fixed area, the variable area, the management data, and the user data from the right end in the codeword. However, the weight is not sufficiently reduced in this order in some cases and thus, it is desirable to arrange the data in an order in which the weight is easy to reduce. A memory controller 300 of the third embodiment is different from the memory controller of the first embodiment in that a codeword having a different data structure is generated.

Figure 26:
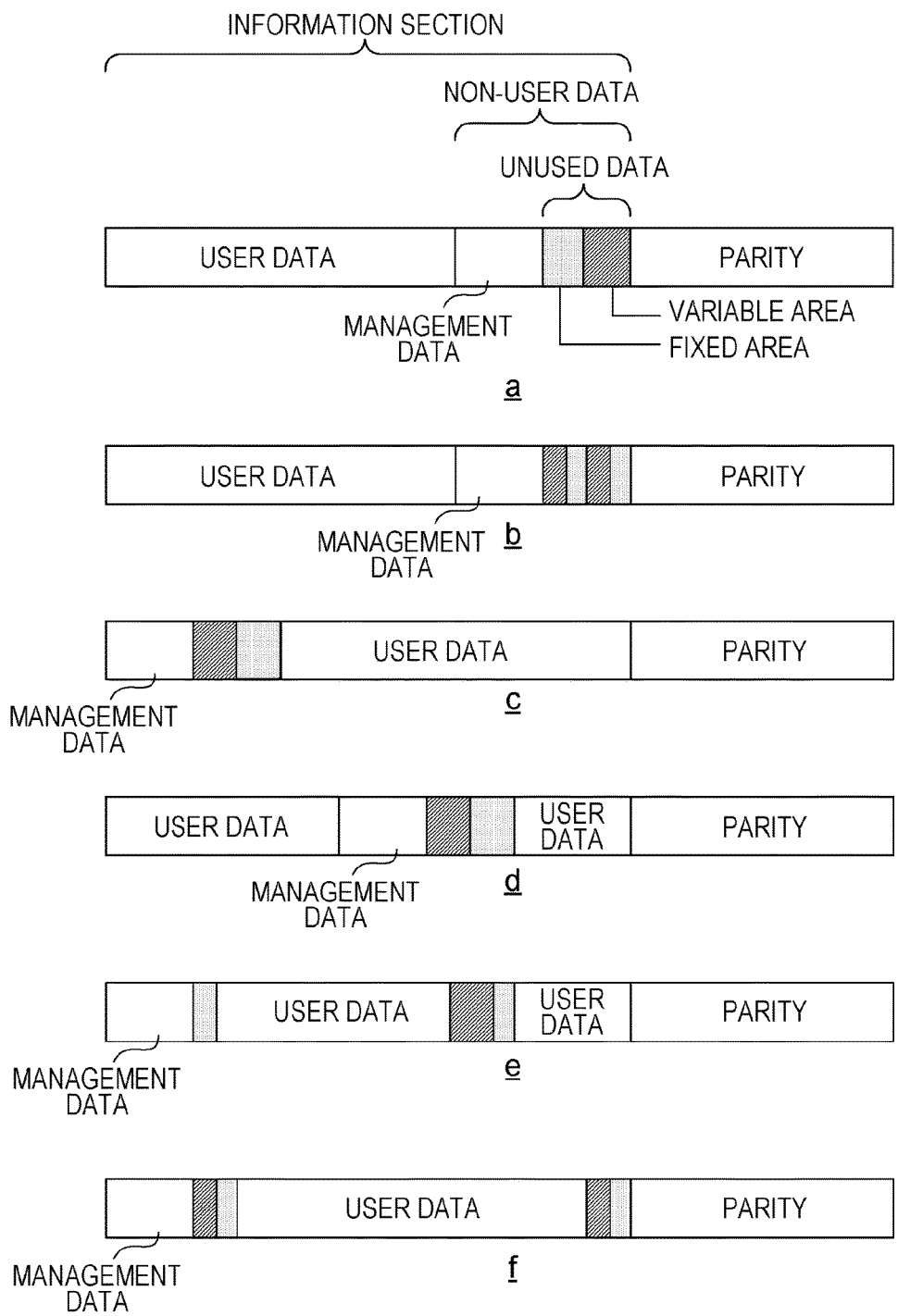
FIG. 26 is a diagram illustrating examples of a data structure of a codeword in a third embodiment.

FIG. 26 is a diagram illustrating examples of the data structure of the codeword in the third embodiment. Gray areas in FIG. 26 indicate the fixed areas and shaded areas indicate the variable areas. In FIG. 26, a is a diagram illustrating an example of the data structure of the codeword in the third embodiment, in which the position of the variable area is changed. This codeword is different from the codeword in the first embodiment in that the position of the variable area and the position of the fixed area are interchanged. That is, the parity, the variable area, the fixed area, the management data, and the user data are arranged in this order from the right end of the codeword.

In FIG. 26, b is a diagram illustrating an example of the data structure of the codeword in the third embodiment, in which the variable areas and the fixed areas are dispersed. For example, each of the variable area and the fixed area is divided into two so as to be arranged in the order of the parity, a part of the fixed area, a part of the variable area, the remainder of the fixed area, the remainder of the variable area, the management data, and the user data sequentially from the right end of the codeword.

In FIG. 26, c is a diagram illustrating an example of the data structure of the codeword in the third embodiment, in which the position of a non-user data area is changed. For example, the parity, the user data and the non-user data are arranged in this order from the right end of the codeword.

In FIG. 26, d is a diagram illustrating an example of the data structure of the codeword in the third embodiment, in which the user data is dispersed. For example, the user data is divided into two so as to be arranged in the order of the parity, a part of the user data, the non-user data, and the remainder of the user data from the right end of the codeword.

In FIG. 26, e is a diagram illustrating an example of the data structure of the codeword in the third embodiment, in which the user data and the non-user data are dispersed. For example, each of the user data and the non-user data is divided into two so as to be arranged in the order of the parity, a part of the user data, a part of the non-user data, the remainder of the user data, and the remainder of the non-user data sequentially from the right end of the codeword.

In FIG. 26, f is a diagram illustrating an example of the data structure of the codeword in the third embodiment, in which the non-user data is dispersed and additionally, the variable areas and the fixed areas are dispersed. For example, the non-user data is divided into two and each of the variable area and the fixed area is also divided into two. For example, the parity, a part of the fixed area, a part of the variable area, the user data, the remainder of the fixed area, the remainder of the variable area, and the management data are arranged in this order from the right end of the codeword.

Note that the data configuration of the codeword is not limited to the configurations exemplified in FIG. 26. For example, the user data or the like may be divided into three or more, or the variable area may be arranged at the left end of the codeword.

As exemplified in FIG. 26, by changing the position of the variable area in which the selection value is saved, the weight of the parity can be changed. For example, it is assumed that the following parity patterns are generated from the information section in which the selection value is arranged at 18th and 19th bits from the right end and all other bits are specified as "0" as in a of FIG. 26, and a certain generator polynomial G(x).

Parity pattern P1 with selection value "01": 00000000 10110100

Parity pattern P2 with selection value "10": 00000001 01101000

Parity pattern P3 with selection value "11": 00000001 11011100

Here, when the same generator polynomial G(x) is used by changing the position of the selection value to 42nd and 43rd bits from the right end as in c of FIG. 26, the following parity patterns are obtained.

Parity pattern P1' with selection value "01": 01000110 11111101

Parity pattern P2' with selection value "10": 10001101 11111010

Parity pattern P3' with selection value "11": 11001011 00000111

Compared with the above parity patterns P1, P2 and P3, the bit depth (weight) of "1" is large in the parity patterns P1', P2' and P3'. In this case, the arrangement in a of FIG. 24 in which the weight becomes smaller is more desirable. Since the optimum position of the variable area changes depending on the data size of the information section, the generator polynomial, and the type of the code, the optimum position is found by generating parities while changing the position of the variable area in several ways and comparing these parities.

As described above, according to the third embodiment of the present technology, by encoding the information section in which the variable area is arranged, for example, at the right neighbor position of the parity, the weight can be reduced and the data holding characteristic can be improved.

4. Fourth Embodiment

In the first embodiment described above, the candidate parity generation unit 330 generates three parity patterns using the parity pattern generation units 331, 332, and 333. That is, the same number of parity pattern generation units as the parity patterns are provided. However, as the number of parity patterns grows, the number of parity pattern generation units increases and there is a fear that the amount of operation and the circuit scale will increase. A candidate parity generation unit 330 of this fourth embodiment is different from the candidate parity generation unit of the first embodiment in that a circuit for generating the parity pattern is cut.

Figure 27:
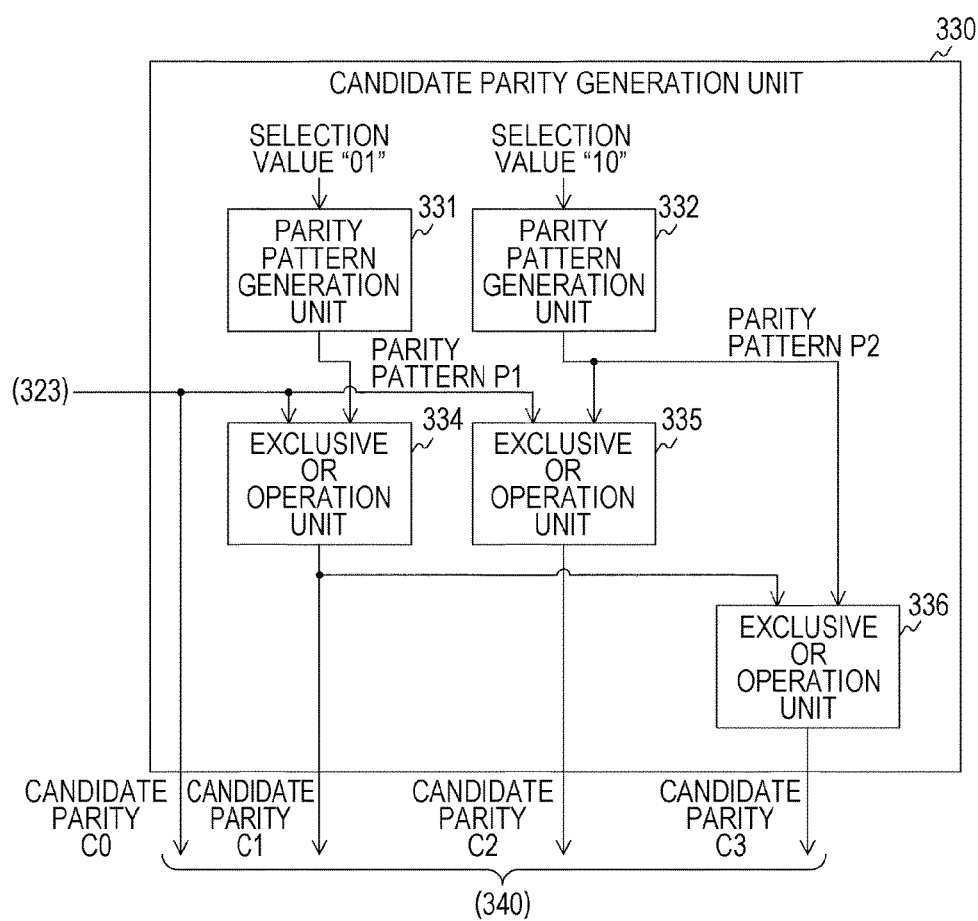
FIG. 27 is a block diagram illustrating a configuration example of a candidate parity generation unit in a fourth embodiment.

FIG. 27 is a block diagram illustrating a configuration example of the candidate parity generation unit 330 in the fourth embodiment. This candidate parity generation unit 330 of the fourth embodiment is different from the candidate parity generation unit of the first embodiment in that the parity pattern generation unit 333 is not provided.

In addition, an exclusive OR operation unit 336 of the fourth embodiment is different from the exclusive OR operation unit of the first embodiment in that the XOR operation is performed for each pair of bits corresponding between the candidate parity C1 and the parity pattern P2. The candidate parity C3 is obtained by this XOR operation. This is because the addition of the codeword including the candidate parity C1 and the codeword including the parity pattern P2 produces the codeword including the candidate parity C3. Note that the exclusive OR operation unit 336 is an example of a fourth candidate parity generation unit described in the claims.

As described above, according to the fourth embodiment of the present technology, the candidate parity generation unit 330 generates the candidate parity P3 by the XOR operation between the candidate parity C1 and the parity pattern P2, thereby being able to cut a circuit for generating the parity pattern P3.

5. Fifth Embodiment

In the first embodiment described above, the memory controller 300 selects the candidate parity having the minimum weight as the selection parity. However, in a case where the bit depth to be consecutively rewritten grows due to the selection parity, there is a fear that the power consumption at the time of writing will become larger. Therefore, it is desirable to reduce the bit depth to be consecutively rewritten. A memory controller 300 of this fifth embodiment is different from the memory controller of the first embodiment in that the bit depth to be consecutively rewritten is reduced.

Figure 28:
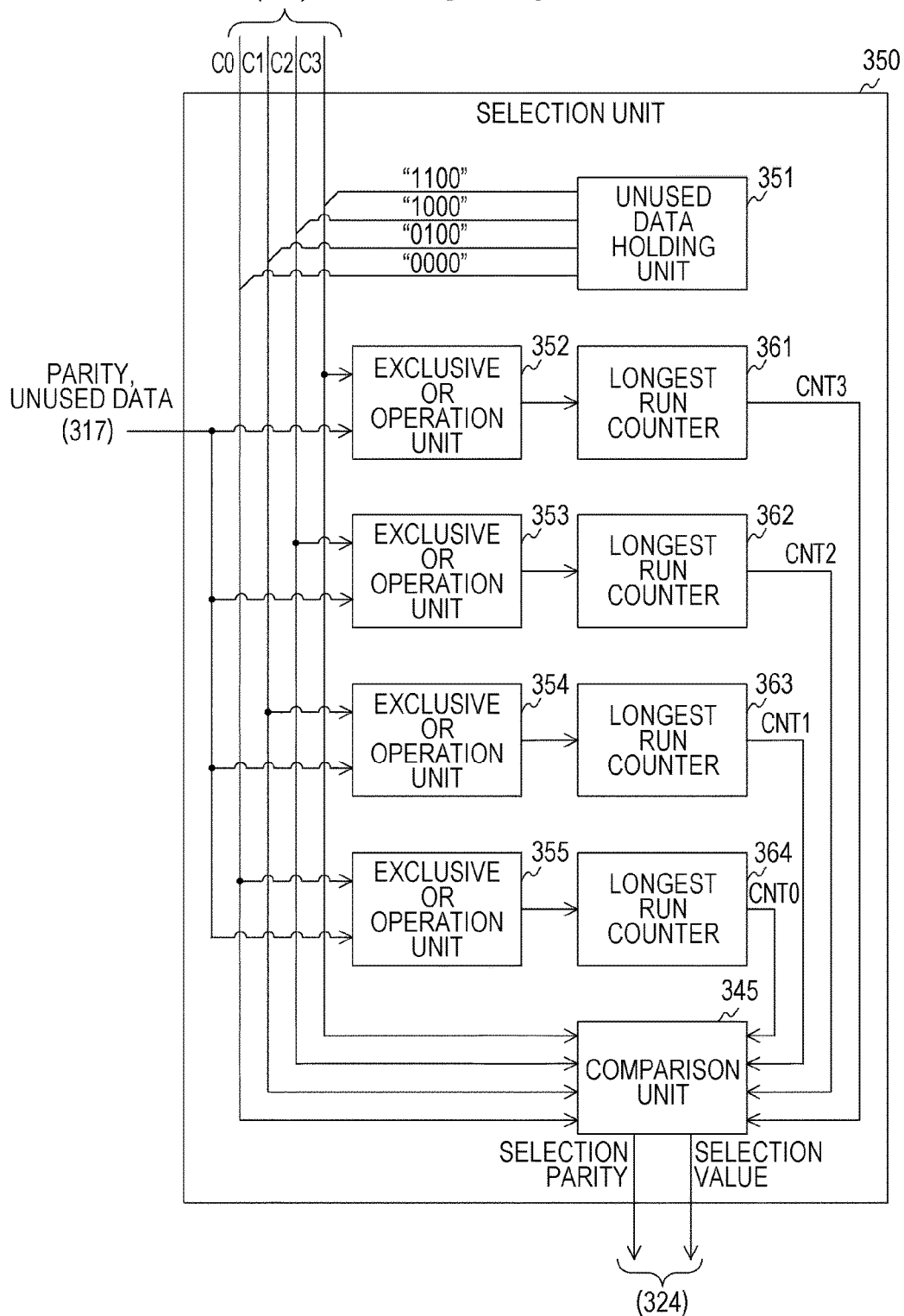
FIG. 28 is a block diagram illustrating a configuration example of a selection unit in a fifth embodiment.

FIG. 28 is a block diagram illustrating a configuration example of a selection unit 350 in the fifth embodiment. This selection unit 350 is provided with an unused data holding unit 351, exclusive OR operation units 352 to 355, longest run counters 361 to 364, and a comparison unit 345. The configurations of the unused data holding unit 351 and the exclusive OR operation units 352 to 355 are similar to those of the second embodiment. In addition, the configuration of the unused data holding unit 351 of the fifth embodiment is similar to that of the second embodiment and the configuration of the comparison unit 345 of the fifth embodiment is similar to that of the first embodiment.

The longest run counter 361 counts the length of run in the operation result of the exclusive OR operation unit 352 and finds the maximum value thereof as the length of the longest run. Here, "run" indicates a group of consecutive bits having a specific value (for example, "1"). In addition, the length of the longest run indicates the maximum value of the bit depth to be consecutively rewritten. The longest run counter 361 supplies the length of the longest run to the comparison unit 345 as the CNT3.

The longest run counter 362 finds the length of the longest run in the operation result of the exclusive OR operation unit 353. This longest run counter 362 supplies the found length to the comparison unit 345 as the CNT2.

The longest run counter 363 finds the length of the longest run in the operation result of the exclusive OR operation unit 354. This longest run counter 363 supplies the found length to the comparison unit 345 as the CNT1.

The longest run counter 364 finds the length of the longest run in the operation result of the exclusive OR operation unit 355. This longest run counter 364 supplies the found length to the comparison unit 345 as the CNT0.

Figure 29:
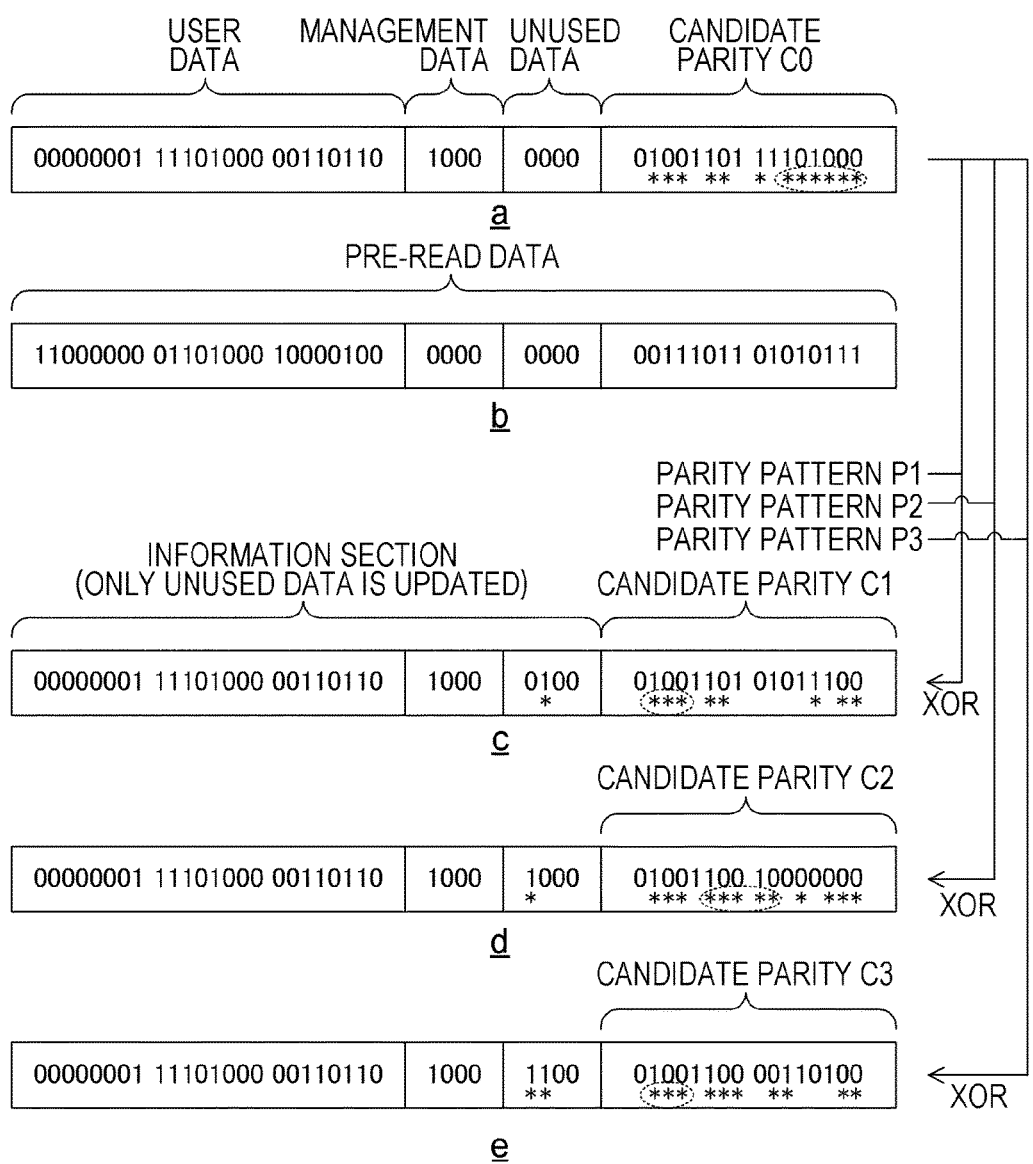
FIG. 29 is a diagram illustrating an example of an information section and candidate parities in the fifth embodiment.

FIG. 29 is a diagram illustrating an example of the information section and the candidate parities in the fifth embodiment. In FIG. 29, a indicates a codeword constituted by the user data, the unused data with the selection value "00", and the candidate parity C0. In FIG. 29, b is a diagram illustrating an example of the pre-read data. Meanwhile, c of FIG. 29 indicates a codeword including the candidate parity C1 and d of FIG. 29 indicates a codeword including the candidate parity C2. In addition, e of FIG. 29 indicates a codeword including the candidate parity C3.

A candidate parity generation unit 330 compares the parity and the unused data in the pre-read data with the candidate parity and the corresponding unused data on a bit basis. The candidate parity generation unit 330 finds the bit depth to be consecutively rewritten (that is, the length of the longest run) for each candidate parity.

In FIG. 29, "*" indicates the position of the rewrite bit. In addition, portions surrounded by dotted lines indicate the longest runs. For example, the length of the longest run in the candidate parity C0 and the unused data "0000" is "6" in decimal number. The length of the longest run in the candidate parity C1 and the unused data "0100" is "3" in decimal number and the length of the longest run in the candidate parity C2 and the unused data "1000" is "5" in decimal number. The length of the longest run in the candidate parity C3 and the unused data "1100" is "3" in decimal number. One of the candidate parities C1 and C3 having the minimum length of the longest run is selected from among these candidate parities.

In general, in a case where the non-volatile memory 400 rewrites data in certain units, as the bit depth to be consecutively rewritten (the length of the longest run) becomes smaller, the power consumption at the time of writing is reduced and the retention is also improved. Therefore, the encoding unit 320 can improve the power consumption and the data holding characteristics of the non-volatile memory 400 by selecting the candidate parity having the minimum length of the longest run.

Figure 30:
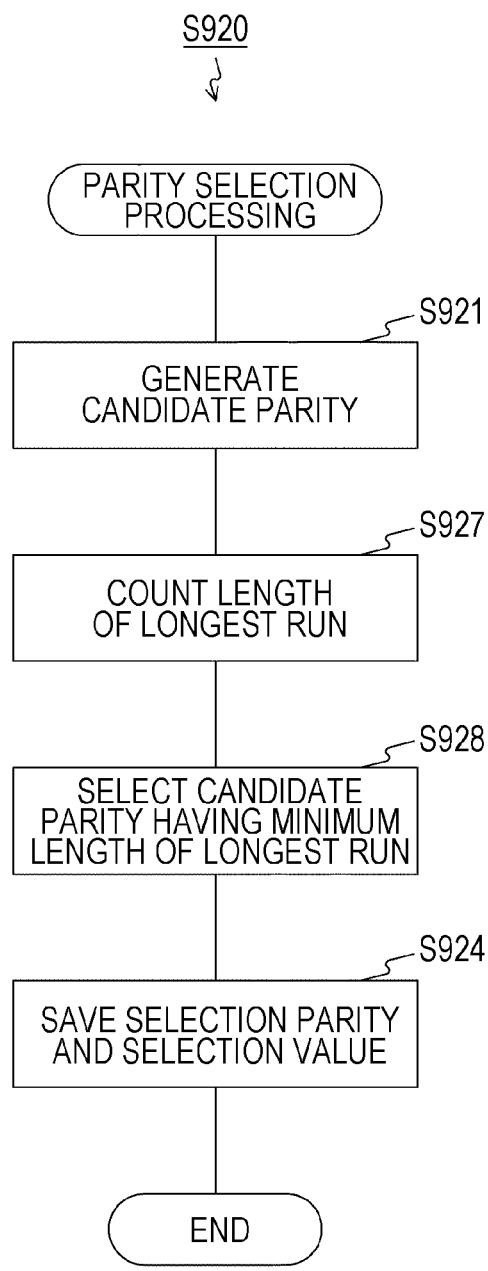
FIG. 30 is a flowchart illustrating an example of parity selection processing in the fifth embodiment.

FIG. 30 is a flowchart illustrating an example of parity selection processing in the fifth embodiment. The parity selection processing of the second embodiment is different from the parity selection processing of the first embodiment in that steps S927 and S928 are executed instead of steps S922 and S923.

The memory controller 300 generates candidate parities (step S921) and counts the length of the longest run for each candidate parity (step S927). The memory controller 300 selects a candidate parity having the minimum length of the longest run (step S928) and executes step S924. Note that controller-side write processing of the fifth embodiment is similar to the controller-side write processing of the second embodiment.

As described above, according to the fifth embodiment of the present technology, the encoding unit 320 selects the parity having the minimum bit depth to be consecutively rewritten, thereby being able to reduce the power consumption of the non-volatile memory 400 at the time of writing to the memory cell.

Note that the above-described embodiments illustrate examples for embodying the present technology and matters in the embodiments and invention specifying matters in the claims individually have correspondence relationships. Likewise, the invention specifying matters in the claims and the matters in the embodiments of the present technology denoted by the same names as those in the claims individually have correspondence relationships. However, the present technology is not limited to the embodiments and can be embodied by subjecting the embodiments to various modifications without departing from the gist thereof.

In addition, the processing procedures described in the above embodiments may be regarded as a method having these series of procedures and additionally, may be regarded as a program for causing a computer to execute these series of procedures or as a recording medium storing the program. As this recording medium, for example, a compact disc (CD), a mini disc (MD), a digital versatile disc (DVD), a memory card, or a Blu-ray (registered trademark) disc can be used.

Note that the effects described herein are not necessarily limited and any effects described in the present disclosure may be applied.

Note that the present technology can be also configured as described below.

(1) An encoding device including:
a first candidate parity generation unit that generates, as a first candidate parity, a parity for detecting an error in an information section in which a predetermined value is assigned in a predetermined variable area;
a second candidate parity generation unit that generates, as a second candidate parity, a parity for detecting an error in the information section in which a value different from the predetermined value is assigned in the predetermined variable area;
a selection unit that selects a parity that satisfies a predetermined condition from among the first and second candidate parities as a selection parity; and
an output unit that outputs a codeword constituted by the information section corresponding to the selection parity and the selection parity.

(2) The encoding device according to above (1), in which the information section includes user data input to the first candidate parity generation unit and unused data including the predetermined variable area.

(3) The encoding device according to above (2), in which the selection unit includes:
a first weight counter that counts, as a weight, the number of bits having a specific value in the first candidate parity and the unused data corresponding to the first candidate parity;
a second weight counter that counts, as a weight, the number of bits having the specific value in the second candidate parity and the unused data corresponding to the second candidate parity; and
a comparison unit that compares respective count values of the first and second weight counters and selects a parity that satisfies the predetermined condition on the basis of a result of the comparison.

(4) The encoding device according to above (2), further including a control unit that reads data written in a memory cell as pre-read data, in which
the selection unit includes: a first rewrite bit depth counter that counts a bit depth of a value different from a value of the pre-read data as a rewrite bit depth in the first candidate parity and the unused data corresponding to the first candidate parity;
a second rewrite bit depth counter that counts a bit depth of a value different from a value of the pre-read data as a rewrite bit depth in the second candidate parity and the unused data corresponding to the second candidate parity, and
a comparison unit that compares the rewrite bit depths counted by the respective first and second rewrite bit depth counters and selects a parity that satisfies the predetermined condition on the basis of a result of the comparison.

(5) The encoding device according to above (2), further including a control unit that reads data written in a memory cell as pre-read data, in which the selection unit includes a first longest run counter that counts the number of consecutive bits having a value different from a value of bits of the pre-read data in the first candidate parity and the unused data corresponding to the first candidate parity and finds a maximum value of the count value as a length of a longest run,
the selection unit further including: a second longest run counter that counts the number of consecutive bits having a value different from a value of bits of the pre-read data in the second candidate parity and the unused data corresponding to the second candidate parity and finds a maximum value of the count value as a length of a longest run; and
a comparison unit that compares the lengths of the longest runs found by the respective first and second longest run number counters and selects a parity that satisfies the predetermined condition on the basis of a result of the comparison.

(6) The encoding device according to any one of above (2) to (5), in which the unused data is arranged between the user data and the selection parity in the codeword.

(7) The encoding device according to any one of above (2) to (5), in which the user data is arranged between the unused data and the selection parity in the codeword.

(8) The encoding device according to any one of above (2) to (5), in which the user data is arranged by being dispersed in a plurality of areas in the codeword.

(9) The encoding device according to any one of above (2) to (5), in which the unused data is arranged by being dispersed in a plurality of areas in the codeword.

(10) The encoding device according to any one of above (2) to (9), in which
the unused data is constituted by the variable area and a fixed area in which a value is not altered, and
the second candidate parity generation unit generates the second candidate parity corresponding to the information section in which a value of the variable area has been altered.

(11) The encoding device according to above (10), in which the variable area is arranged by being dispersed in a plurality of areas in the codeword.

(12) The encoding device according to above (10) or (11), in which the fixed area is arranged by being dispersed in a plurality of areas in the codeword.

(13) The encoding device according to any one of above (1) to (12), in which
the first candidate parity generation unit generates the first candidate parity from the information section, and
the second candidate parity generation unit generates the second candidate parity by a logical operation between the first candidate parity and a first parity pattern.

(14) The encoding device according to above (13), further including:
a third candidate parity generation unit that generates a third candidate parity by a logical operation between a second parity pattern and the first candidate parity; and
a fourth candidate parity generation unit that generates a fourth candidate parity by a logical operation between the second parity pattern and the second candidate parity, in which
the selection unit selects a parity that satisfies the predetermined condition from among the first, second, third, and fourth candidate parities as the selection parity.

(15) The encoding device according to any one of above (1) to (14), further including a user data conversion unit that performs conversion processing of converting a bit depth of a specific value in the user data and outputs either the user data after the conversion processing or the user data before the conversion processing to the first candidate parity generation unit, in which the first candidate parity generation unit generates the first candidate parity from the first information section including the output user data.

(16) A memory controller including:

a first candidate parity generation unit that generates, as a first candidate parity, a parity for detecting an error in an information section in which a predetermined value is assigned in a predetermined variable area;

a second candidate parity generation unit that generates, as a second candidate parity, a parity for detecting an error in the information section in which a value different from the predetermined value is assigned in the predetermined variable area;

a selection unit that selects a parity that satisfies a predetermined condition from among the first and second candidate parities as a selection parity;

an output unit that outputs a codeword constituted by the information section corresponding to the selection parity and the selection parity to a memory cell as write data; and a decoding unit that reads read data from the memory cell and decodes the read data.

(17) A communication system including:

a first candidate parity generation unit that generates, as a first candidate parity, a parity for detecting an error in an information section in which a predetermined value is assigned in a predetermined variable area;

a second candidate parity generation unit that generates, as a second candidate parity, a parity for detecting an error in the information section in which a value different from the predetermined value is assigned in the predetermined variable area;

a selection unit that selects a parity that satisfies a predetermined condition from among the first and second candidate parities as a selection parity;

an output unit that outputs a codeword constituted by the information section corresponding to the selection parity and the selection parity as a transmission word; and a decoding unit that receives a received word corresponding to the transmission word to decode.

(18) An encoding method including:

a first candidate parity generation procedure of generating, as a first candidate parity, a parity for detecting an error in an information section in which a predetermined value is assigned in a predetermined variable area;

a second candidate parity generation procedure of generating, as a second candidate parity, a parity for detecting an error in the information section in which a value different from the predetermined value is assigned in the predetermined variable area;

a selection procedure of selecting a parity that satisfies a predetermined condition from among the first and second candidate parities as a selection parity; and an output procedure of outputting a codeword constituted by the information section corresponding to the selection parity and the selection parity.

REFERENCE SIGNS LIST

100 Host computer
200 Storage
300 Memory controller
311 System interface
312 RAM
313 CPU
314 ECC processing unit
315 ROM
316, 450 Bus
317 Memory interface
320 Encoding unit
321 Write buffer
322, 325 User data conversion unit
323 ECC encoder
324 Write data output unit
330 Candidate parity generation unit
331, 332, 333 Parity pattern generation unit
334, 335, 336, 352, 353, 354, 355 Exclusive OR operation unit
337 Parity pattern holding unit
340, 350 Selection unit
341, 342, 343, 344 Weight counter
345 Comparison unit
346, 347, 348 Adder
351 Unused data holding unit
356, 357, 358, 359 Rewrite bit depth counter
361, 362, 363, 364 Longest run counter
370 Decoding unit
371 Read buffer
372 User data reverse conversion unit
373 ECC decoder
380, 381 Command control unit
400 Non-volatile memory
410 Data buffer
420 Memory cell array
430 Driver
440 Address decoder
460 Control interface
470 Memory control unit

The invention claimed is:

1. A encoding device comprising:
a first candidate parity generation unit that generates, as a first candidate parity, a parity for detecting an error in an information section in which a predetermined value is assigned in a predetermined variable area;
a second candidate parity generation unit that generates, as a second candidate parity, a parity for detecting an error in the information section in which a value different from the predetermined value is assigned in the predetermined variable area;
a selection unit that selects a parity that satisfies a predetermined condition from among the first and second candidate parities as a selection parity; and
an output unit that outputs a codeword constituted by the information section corresponding to the selection parity and the selection parity,
wherein
the information section includes user data input to the first candidate parity generation unit and unused data including the predetermined variable area.

2. The encoding device according to claim 1, wherein the selection unit includes:
a first weight counter that counts, as a weight, the number of bits having a specific value in the first candidate parity and the unused data corresponding to the first candidate parity;
a second weight counter that counts, as a weight, the number of bits having the specific value in the second candidate parity and the unused data corresponding to the second candidate parity; and
a comparison unit that compares respective count values of the first and second weight counters and selects a parity that satisfies the predetermined condition on the basis of a result of the comparison.

3. The encoding device according to claim 1, further comprising a control unit that reads data written in a memory cell as pre-read data, wherein
the selection unit includes: a first rewrite bit depth counter that counts a bit depth of a value different from a value of the pre-read data as a rewrite bit depth in the first candidate parity and the unused data corresponding to the first candidate parity;
a second rewrite bit depth counter that counts a bit depth of a value different from a value of the pre-read data as a rewrite bit depth in the second candidate parity and the unused data corresponding to the second candidate parity, and
a comparison unit that compares the rewrite bit depths counted by the respective first and second rewrite bit depth counters and selects a parity that satisfies the predetermined condition on the basis of a result of the comparison.

4. The encoding device according to claim 1, further comprising a control unit that reads data written in a memory cell as pre-read data, wherein
the selection unit includes a first longest run counter that counts the number of consecutive bits having a value different from a value of bits of the pre-read data in the first candidate parity and the unused data corresponding to the first candidate parity and finds a maximum value of the count value as a length of a longest run,
the selection unit further including: a second longest run counter that counts the number of consecutive bits having a value different from a value of bits of the pre-read data in the second candidate parity and the unused data corresponding to the second candidate parity and finds a maximum value of the count value as a length of a longest run; and
a comparison unit that compares the lengths of the longest runs found by the respective first and second longest run number counters and selects a parity that satisfies the predetermined condition on the basis of a result of the comparison.

5. The encoding device according to claim 1, wherein the unused data is arranged between the user data and the selection parity in the codeword.

6. The encoding device according to claim 1, wherein the user data is arranged between the unused data and the selection parity in the codeword.

7. The encoding device according to claim 1, wherein the user data is arranged by being dispersed in a plurality of areas in the codeword.

8. The encoding device according to claim 1, wherein the unused data is arranged by being dispersed in a plurality of areas in the codeword.

9. The encoding device according to claim 1, wherein
the unused data is constituted by the variable area and a fixed area in which a value is not altered, and
the second candidate parity generation unit generates the second candidate parity corresponding to the information section in which a value of the variable area has been altered.

10. The encoding device according to claim 9, wherein the variable area is arranged by being dispersed in a plurality of areas in the codeword.

11. The encoding device according to claim 9, wherein the fixed area is arranged by being dispersed in a plurality of areas in the codeword.

12. The encoding device according to claim 1, wherein
the first candidate parity generation unit generates the first candidate parity from the information section, and
the second candidate parity generation unit generates the second candidate parity by a logical operation between the first candidate parity and a first parity pattern.

13. The encoding device according to claim 12, further comprising:
a third candidate parity generation unit that generates a third candidate parity by a logical operation between a second parity pattern and the first candidate parity; and
a fourth candidate parity generation unit that generates a fourth candidate parity by a logical operation between the second parity pattern and the second candidate parity, wherein
the selection unit selects a parity that satisfies the predetermined condition from among the first, second, third, and fourth candidate parities as the selection parity.

14. The encoding device according to claim 1, further comprising a user data conversion unit that performs conversion processing of converting a bit depth of a specific value in the user data and outputs either the user data after the conversion processing or the user data before the conversion processing to the first candidate parity generation unit, wherein
the first candidate parity generation unit generates the first candidate parity from the first information section including the output user data.

15. A memory controller comprising:
a first candidate parity generation unit that generates, as a first candidate parity, a parity for detecting an error in an information section in which a predetermined value is assigned in a predetermined variable area;
a second candidate parity generation unit that generates, as a second candidate parity, a parity for detecting an error in the information section in which a value different from the predetermined value is assigned in the predetermined variable area;
a selection unit that selects a parity that satisfies a predetermined condition from among the first and second candidate parities as a selection parity;
an output unit that outputs a codeword constituted by the information section corresponding to the selection parity and the selection parity to a memory cell as write data; and
a decoding unit that reads read data from the memory cell and decodes the read data,
wherein the information section includes user data input to the first candidate parity generation unit and unused data including the predetermined variable area.

16. A communication system comprising:
a first candidate parity generation unit that generates, as a first candidate parity, a parity for detecting an error in an information section in which a predetermined value is assigned in a predetermined variable area;
a second candidate parity generation unit that generates, as a second candidate parity, a parity for detecting an error in the information section in which a value different from the predetermined value is assigned in the predetermined variable area;
a selection unit that selects a parity that satisfies a predetermined condition from among the first and second candidate parities as a selection parity;
an output unit that outputs a codeword constituted by the information section corresponding to the selection parity and the selection parity as a transmission word; and
a decoding unit that receives a received word corresponding to the transmission word to decode, wherein the information section includes user data input to the first candidate parity generation unit and unused data including the predetermined variable area.

17. An encoding method comprising:

a first candidate parity generation procedure of generating, as a first candidate parity, a parity for detecting an error in an information section in which a predetermined value is assigned in a predetermined variable area;

a second candidate parity generation procedure of generating, as a second candidate parity, a parity for detecting an error in the information section in which a value different from the predetermined value is assigned in the predetermined variable area;

a selection procedure of selecting a parity that satisfies a predetermined condition from among the first and second candidate parities as a selection parity; and an output procedure of outputting a codeword constituted by the information section corresponding to the selection parity and the selection parity, wherein the information section includes user data input to the first candidate parity generation procedure and unused data including the predetermined variable area.

* * * * *